(12) United States Patent
Sekikawa

(10) Patent No.: US 9,679,858 B2
(45) Date of Patent: Jun. 13, 2017

(54) SEMICONDUCTOR DEVICE AND METHOD OF MANUFACTURING SAME

(71) Applicant: Renesas Electronics Corporation, Tokyo (JP)

(72) Inventor: Hiroaki Sekikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/231,820

(22) Filed: Aug. 9, 2016

(65) Prior Publication Data

US 2017/0062362 A1 Mar. 2, 2017

(30) Foreign Application Priority Data

Aug. 26, 2015 (JP) ................. 2015-167283

(51) Int. Cl.
*H01L 23/00* (2006.01)

(52) U.S. Cl.
CPC .............. *H01L 24/02* (2013.01); *H01L 24/45* (2013.01); *H01L 2224/024* (2013.01); *H01L 2224/0218* (2013.01); *H01L 2224/0219* (2013.01); *H01L 2224/0239* (2013.01); *H01L 2224/02315* (2013.01); *H01L 2224/02331* (2013.01); *H01L 2224/02373* (2013.01); *H01L 2224/4502* (2013.01); *H01L 2224/45147* (2013.01); *H01L 2924/01022* (2013.01); *H01L 2924/01029* (2013.01); *H01L 2924/01046* (2013.01); *H01L 2924/04941* (2013.01); *H01L 2924/07025* (2013.01); *H01L 2924/3511* (2013.01); *H01L 2924/35121* (2013.01)

(58) Field of Classification Search
CPC . H01L 24/02; H01L 24/45; H01L 2224/0218; H01L 2224/02331; H01L 2224/0239; H01L 2224/024; H01L 2924/01029; H01L 2924/01022; H01L 2924/01046; H01L 2224/02315; H01L 2224/02373; H01L 2224/0219
See application file for complete search history.

(56) References Cited

U.S. PATENT DOCUMENTS

| 6,198,165 | B1 * | 3/2001 | Yamaji ................ H01L 23/3128 257/668 |
| 7,812,456 | B2 | 10/2010 | Koide et al. |
| 2008/0237787 | A1 | 10/2008 | Yonezu et al. |

(Continued)

FOREIGN PATENT DOCUMENTS

| JP | 05-258017 A | 10/1993 |
| JP | 2012-253071 A | 12/2012 |

(Continued)

*Primary Examiner* — Roy Potter
*Assistant Examiner* — Paul Patton
(74) *Attorney, Agent, or Firm* — Mattingly & Malur, PC

(57) ABSTRACT

To provide a semiconductor device having improved reliability. The semiconductor device is equipped with a first polyimide film, rewirings formed over the first polyimide film, first and second dummy patterns formed over the first polyimide film, a second polyimide film that covers the rewirings and the dummy patterns, and an opening portion that exposes a portion of the rewirings in the second polyimide film. The first dummy pattern is, in plan view, comprised of a closed pattern surrounding the rewirings while having a space therebetween.

18 Claims, 36 Drawing Sheets

(56) References Cited

U.S. PATENT DOCUMENTS

2012/0306106 A1  12/2012  Takada
2014/0021618 A1   1/2014  Shigihara et al.

FOREIGN PATENT DOCUMENTS

JP        6132162 B2    1/2013
JP     2014-022505 A    2/2014
JP        6412552 B2    2/2014

* cited by examiner

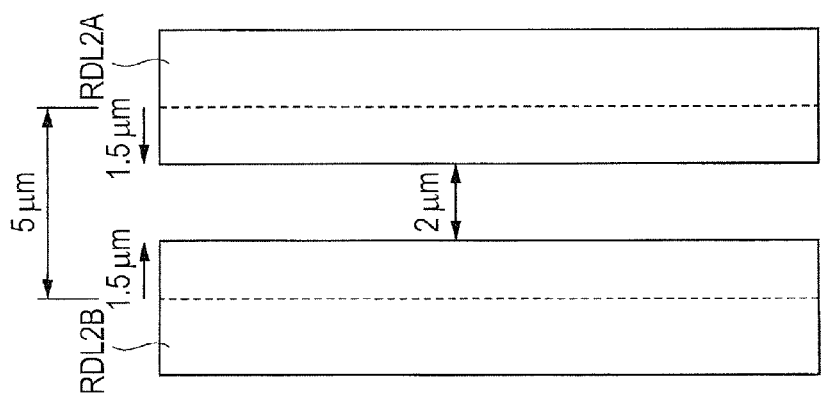
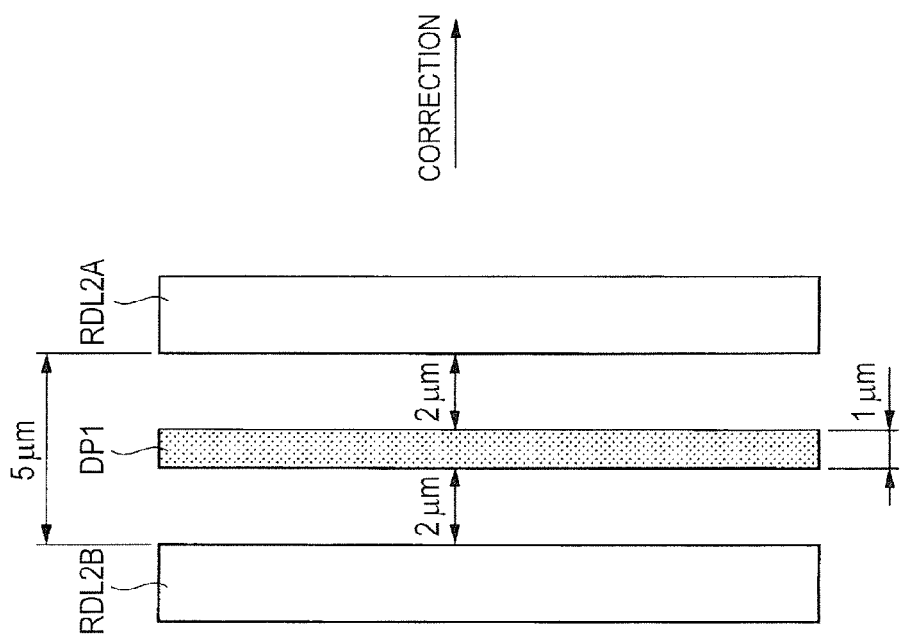

SEMICONDUCTOR DEVICE AND METHOD OF MANUFACTURING SAME

CROSS-REFERENCE TO RELATED APPLICATIONS

The disclosure of Japanese Patent Application No. 2015-167283 filed on Aug. 26, 2015 including the specification, drawings, and abstract is incorporated herein by reference in its entirety.

BACKGROUND

The present invention relates to a semiconductor device and its manufacturing technology, for example, a semiconductor device having a rewiring (redistribution layer) and a technology effective when it is applied to the manufacturing technology of the semiconductor device.

Japanese Unexamined Patent Application Publication No. 2014-22505 (Patent Document 1) describes a structure in which a rewiring is comprised of a copper film (Cu film), a nickel film (Ni film), and a palladium film (Pd film) successively stacked from the side of a semiconductor substrate and a copper wire is coupled to the upper surface of the palladium film.

Japanese Patent No. 5412552 (Patent Document 2) describes that a predetermined or more occupancy of a rewiring is required for stable formation of a copper film by plating.

Japanese Patent No. 5132162 (Patent Document 3) describes arrangement of a dummy pattern at the side of a fuse wiring as an arrangement example of a dummy pattern around a wiring.

Japanese Unexamined Patent Application Publication No. 2012-253071 (Patent Document 4) describes a technology of placing a dummy pattern comprised of a dot pattern around a wiring layer.

Japanese Unexamined Patent Application Publication No. Hei 5(1993)-258017 (Patent Document 5) describes a technology of arranging dummy patterns in mesh form at the entire periphery except wirings.

PATENT DOCUMENT

[Patent Document 1] Japanese Unexamined Patent Application Publication No. 2014-22505
[Patent Document 2] Japanese Patent No. 5412552
[Patent Document 3] Japanese Patent No. 5132162
[Patent Document 4] Japanese Unexamined Patent Application Publication No. 2012-253071
[Patent Document 5] Japanese Unexamined Patent Application Publication No. Hei 5(1993)-258017

SUMMARY

Development trends of semiconductor devices to be used for, for example, consumer products typified by household electric appliances or communication equipment are to reduce power consumption, downsize the device, and reduce a production cost. Semiconductor devices for vehicles, on the other hand, need improvement in reliability of high-voltage operation under high-temperature environments in addition to the above-described development trends. In order to meet these trends, using an inexpensive copper (Cu) wire instead of an expensive gold (Au) wire have been investigated from the standpoint of promoting cost reduction. In this case, however, a copper wire harder than a gold wire is likely to damage a pad to which the wire is coupled. When a copper wire is used, therefore, not coupling the copper wire directly to a pad but formation of a rewiring made of a copper wiring to be coupled to a pad and coupling this rewiring to the copper wire is under investigation. This rewiring structure enables reduction in ON resistance of a power transistor due to the use of a thick-film rewiring or reduction in chip area attributable to a wiring layout design using the rewiring. Further, cost reduction can be achieved by using a coupling structure to an inexpensive copper wire and at the same time, improvement in radiation property can be achieved by increasing an area occupied by a rewiring.

In such a rewiring structure, due to low adhesion between a rewiring composed mainly of a copper film and a copper wire, a bonding film is formed on the surface of the rewiring in order to improve adhesion with the copper wire. As a result of investigation, however, the present inventors have found newly that corrosion of the rewiring (copper film) occurs due to peeling of the bonding film. According to the investigation by the present inventors, therefore, there is room of improvement in the conventionally used rewiring structure from the standpoint of reliability of a semiconductor device.

Another problem and novel features of the invention will be apparent from the description herein and accompanying drawings.

In a semiconductor device according to one embodiment, a conductor pattern is arranged so as to surround, in plan view, a rewiring, while having a space therebetween and this conductor pattern is comprised of a closed pattern.

According to the one embodiment, a semiconductor device having improved reliability can be provided.

BRIEF DESCRIPTION OF THE DRAWINGS

FIG. 32A and FIG. 32B are schematic views describing the details of second correction processing at a layout data creation unit;

DETAILED DESCRIPTION

Figure 1:
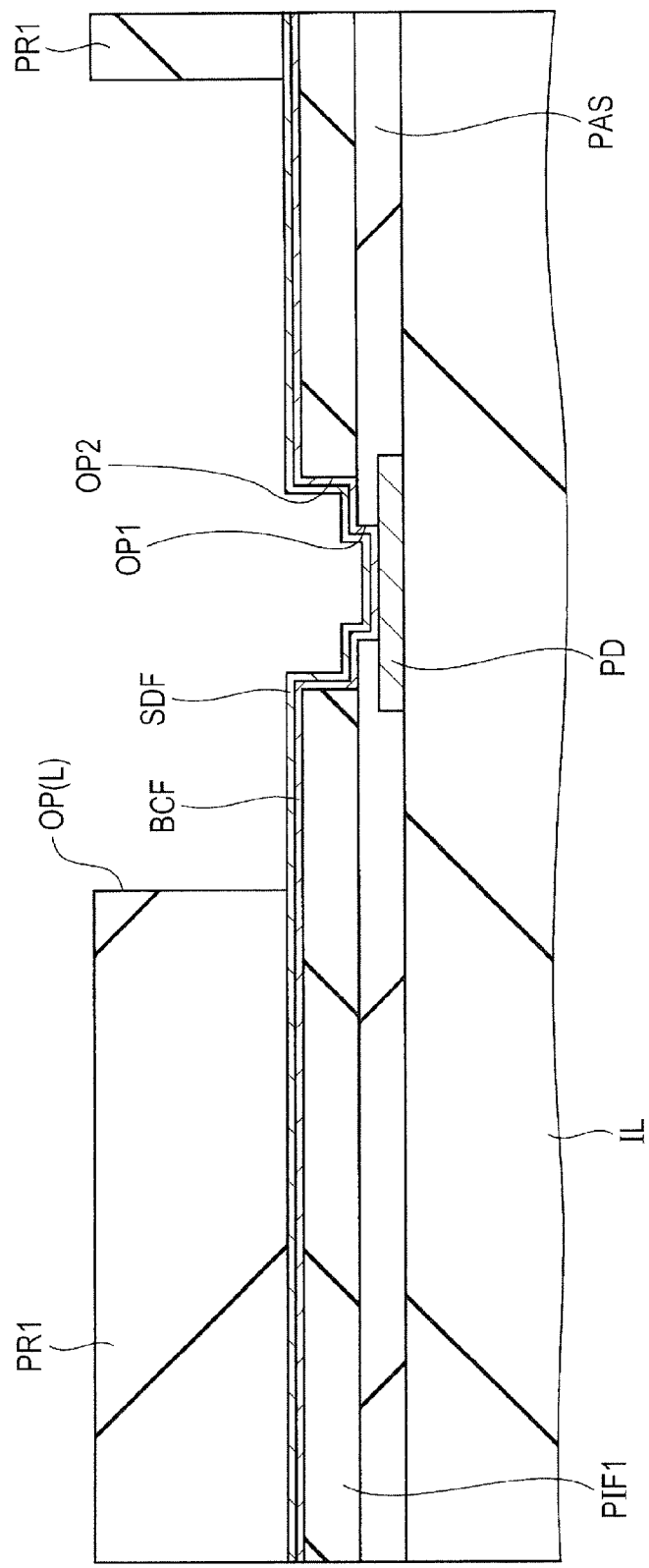
FIG. 1 is a simplified cross-sectional view showing a manufacturing step of a rewiring structure in the related art.

In the following embodiments, a description will be made after divided into a plurality of sections or embodiments if necessary for the sake of convenience. These sections or embodiments are not independent from each other unless otherwise particularly specified, but one of them may be a modification example, details, complementary description, or the like of a part or whole of the other one.

In the following embodiments, when a reference is made to the number (including the number, value, amount, range, or the like) of a component, the number is not limited to a specific number but may be more or less than the specific number, unless otherwise particularly specified or principally apparent that the number is limited to the specific number.

Further, it is needless to say that in the following embodiments, the constituent component (including component step or the like) is not always essential unless otherwise particularly specified or principally apparent that it is essential.

Similarly, in the following embodiments, when a reference is made to the shape, positional relationship, or the like of the constituent component, that substantially approximate or analogous to its shape or the like is also embraced unless otherwise particularly specified or principally apparent that it is not. This also applies to the above-described number and range.

In all the drawings for describing the embodiment, the same members will be identified by the same reference numerals in principle and overlapping descriptions will be omitted. To facilitate understanding the drawings, even plan views are sometimes hatched.

First Embodiment

<Investigation of Improvement>

Room for improvement found, in the related art, newly by the present inventors will be described first while referring to drawings. The term "related art" as used herein means a technology having a problem found newly by the present inventors and is not a known conventional technology. It is a technology described as a premise technology (unknown technology) of a novel technical concept.

Figure 2:
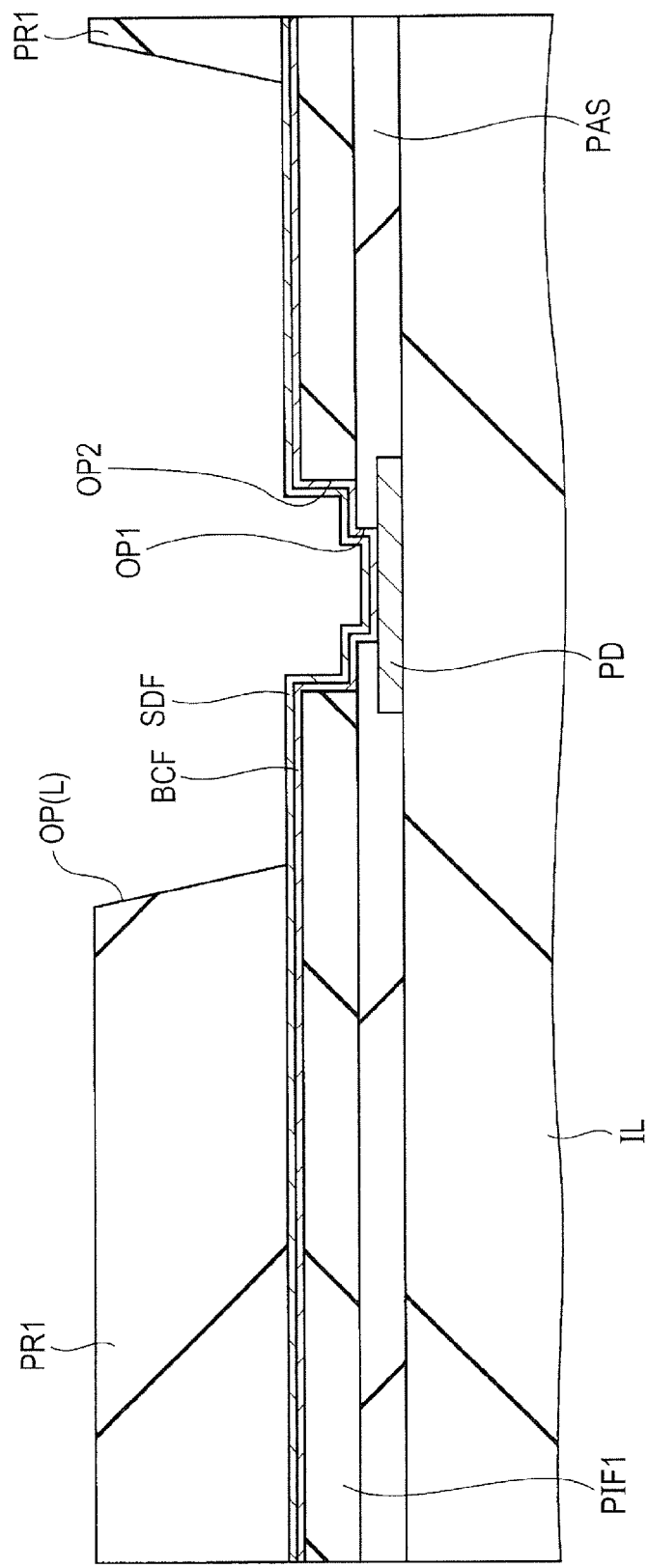
FIG. 2 is another simplified cross-sectional view showing a manufacturing step of the rewiring structure in the related art.
Figure 3:
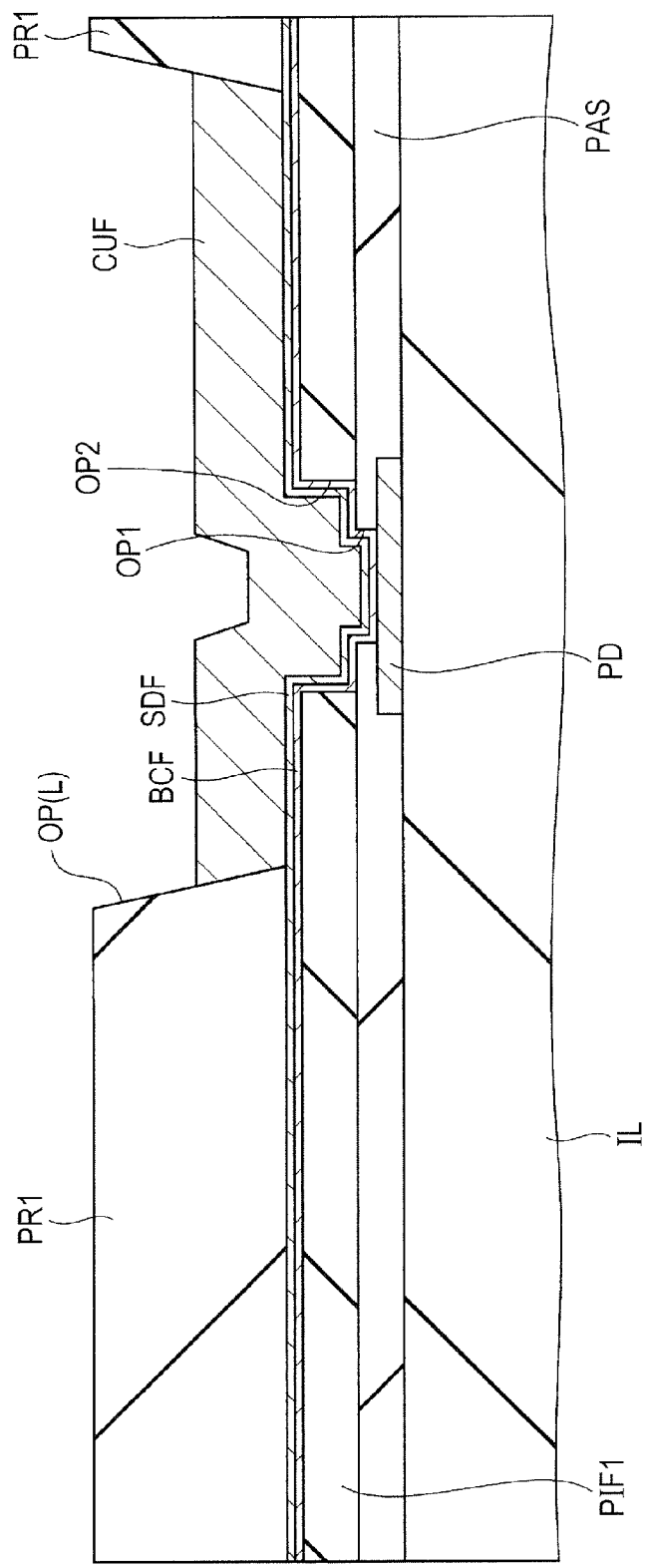
FIG. 3 is a further simplified cross-sectional view showing a manufacturing step of the rewiring structure in the related art.

FIGS. 1 to 3 are simplified cross-sectional views of a manufacturing step of a rewiring structure in the related art. In FIG. 1, an interlayer insulating film IL has thereon a pad PD and the interlayer insulating film IL covering the pad PD has thereon a surface protection film (passivation film) PAS made of, for example, a silicon oxide film or a silicon nitride film. This surface protection film PAS has therein an opening portion OP1 and from this opening portion OP1, the surface of the pad PD is partially exposed. The surface protection film PAS having therein the opening portion OP1 has thereon a polyimide film PIF1 and this polyimide film PIF1 has therein an opening portion OP2 which couples with the opening portion OP1. The polyimide film PIF1 including the inner wall of the opening portion OP1 and the inner wall of the opening portion OP2 has thereon a barrier conductor film BCF made of, for example, a titanium film or a titanium nitride film. This barrier conductor film BCF has thereon a seed film SDF made of a copper film. This seed film SDF has thereon a resist film PR1 and this resist film PR1 is a patterned one. More specifically, the patterning of the resist film PR1 has been performed so as to form therein an opening portion OP(L) for forming a wiring, forming a rewiring. Manufacturing steps of the above-described structure are omitted, but the structure shown in FIG. 1 is formed by these omitted steps.

It is necessary that in this structure, the rewiring formed is as thick as, for example, about 10 μm and the opening portion OP(L) for forming the wiring has a depth equal to or greater than the thickness of the rewiring. The resist film PR1 is therefore required to be as thick as about 15 μm. The resist film PR1 is patterned typically by exposure treatment but when the resist film PR1 is thick, the resist film PR1 after patterning cannot always have a stable shape by exposure treatment only. With a view to forming a stable pattern shape, the resist film PR1 subjected to exposure treatment is then subjected to, for example, curing treatment for curing the resist film PR1 by exposure to ultraviolet rays. Curing the resist film PR1 enables the patterned resist film to have a more stable shape.

When the resist film PR1 is subjected to curing treatment, however, shrinkage of the resist film PR1 occurs. Particularly in the surface of the resist film PR1 directly exposed to ultraviolet rays, the shrinkage of the resist film PR1 becomes marked. Curing treatment of the patterned resist film PR1 therefore increases shrinkage of the surface of the resist film PR1. This results in inclination, into a tapered shape, of the side surface of the opening portion OP(L) for forming the wiring as shown in FIG. 2.

When in such a state, a copper film CUF is caused to grow on the seed film SDF exposed from the opening portion OP(L) for forming the wiring by electroplating as shown in FIG. 3, the side surface of the copper film CUF inevitably has an inverted tapered shape because the opening portion OP(L) for forming the wiring has a tapered side surface. The present inventors have thus found newly that the side surface of the copper film CUF formed by electroplating has an inverted tapered shape when the resist film PR1 is subjected to curing treatment.

In the above-described structure, the rewiring comprised mainly of the copper film CUF is coupled to a copper wire. Since adhesion between the copper film CUF and the copper wire is not good, it is the common practice not to directly couple the copper film CUF to the copper wire but insert a bonding film between the copper film CUF and the copper wire. Described specifically, it is the common practice to form a stacked film of a nickel film and a gold film in a partial region of the surface of the copper film CUF and couple the copper film CUF to the copper wire via the stacked film. In this case, the copper wire is directly coupled to the gold film superior in adhesion so that the coupling reliability between the rewiring and the copper wire can be improved. In this configuration, the nickel film and the gold film are formed typically by plating. Even when the copper film CUF has an inverted tapered side surface, deterioration in the reliability of the rewiring due to the inverted tapered shape does not become apparent.

However, it has recently been investigated to use, as the bonding film, a stacked film of a titanium film (Ti film) and a palladium film (Pd film) superior in adhesion with the copper film CUF, instead of an expensive gold film, in order to reduce a manufacturing cost of a semiconductor device. Further, when the stacked film of a titanium film and a palladium film is used as the bonding film because of a cost lower than that of the gold film, not only a portion of the surface of the copper film CUF but also the surface and side surface of the copper film CUF may be covered with it. In short, using the stacked film of a titanium film and a palladium film is advantageous that not only it improves adhesion between the copper film CUF and the copper wire but also it adds another function of protecting the copper film CUF from corrosion or the like. When the gold film is used as the bonding film, the gold film is formed only in a bonding region to the copper wire in order to suppress a using amount of such an expensive gold film to the minimum. On the other hand, the stacked film of a titanium film and a palladium film can be formed so as to cover not only the bonding region to the copper wire but also the surface and the side surface of the copper film CUF because it needs a cost lower than that of the gold film. In short, using, as the bonding film, the stacked film of a titanium film and a palladium film therefore contributes to cost reduction of a semiconductor device and also to protection of the copper film CUF from corrosion or the like. As a result, a semiconductor device having improved reliability can be provided.

The present inventors have found newly that when the stacked film of a titanium film and a palladium film is used as the bonding film, however, room for improvement becomes apparent because the copper film CUF has an inverted tapered side surface. Described specifically, in order to cover the surface and side surface of the copper film CUF with the stacked film of a titanium film and a palladium film, for example, sputtering is used. Since the copper film CUF formed by sputtering has an inverted tapered side surface, room for improvement becomes apparent. A description will next be made on this point.

Figure 4:
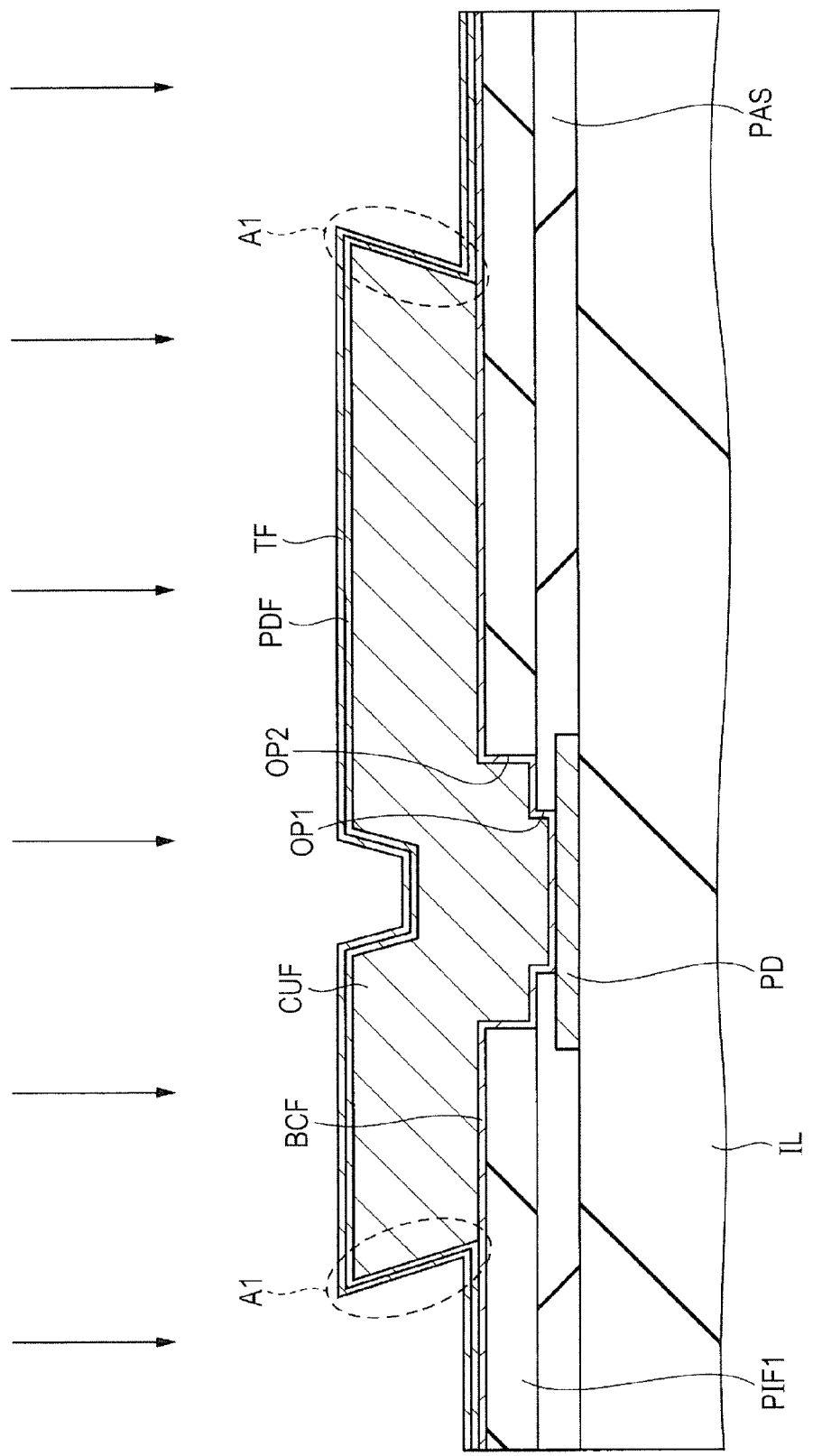
FIG. 4 schematically shows, when a copper film has an inverted tapered side surface, formation of a stacked film of a titanium film and a palladium film and a titanium film by sputtering so as to cover the surface and the side surface of the copper film.

FIG. 4 schematically shows formation of a stacked film PDF of a titanium film and a palladium film and a titanium film TF by sputtering so as to cover the surface and side surface of the copper film CUF when the copper film CUF has an inverted tapered side surface. Since sputtering shown by the arrows in FIG. 4 has directivity, the thickness of the stacked film PDF and that of the titanium film TF in a region A1 in the vicinity of the side surface of the copper film CUF become thinner than those in the other region. In other words, when the copper film CUF has an inverted tapered side surface, film forming particles do not adhere well to the side surface of the copper film CUF, leading to thinning of the stacked film PDF and the titanium film TF. Patterning of the titanium film TF or the stacked film PDF by wet etching under such a state is likely to cause peeling of the titanium film TF or the stacked film PDF in the region A1 in the vicinity of the side surface of the copper film CUF. This film peeling then causes corrosion of the copper film CUF. In addition, foreign matters are produced by this film peeling. Thus, when the copper film CUF has an inverted tapered side surface, the semiconductor device thus manufactured may inevitably have deteriorated reliability or a yield in the manufacturing steps of the semiconductor device may be reduced.

Thus, when the copper film CUF has an inverted tapered side surface, even covering of the surface and side surface of the copper film CUF by the stacked film PDF of a titanium film and a palladium film to protect them with the stacked film results in failure because, due to thinning of the stacked film PDF on the side surface of the copper film CUF, film peeling or generation of foreign matters occurs, which becomes apparent as room for improvement. In particular, this room for improvement becomes apparent when the stacked film PDF is formed by sputtering.

In First Embodiment, a measure is taken to overcome the above-described problem of the related art to be improved. The technical concept of First Embodiment taking this measure will hereinafter be described. First, a description will be made on the finding of the present inventors. Then, a control strategy for actualizing this finding will be described and then, another problem which will appear in this control strategy will next be described. The technical concept of First Embodiment then follows.

<Finding by the Present Inventors>

Figure 5A:
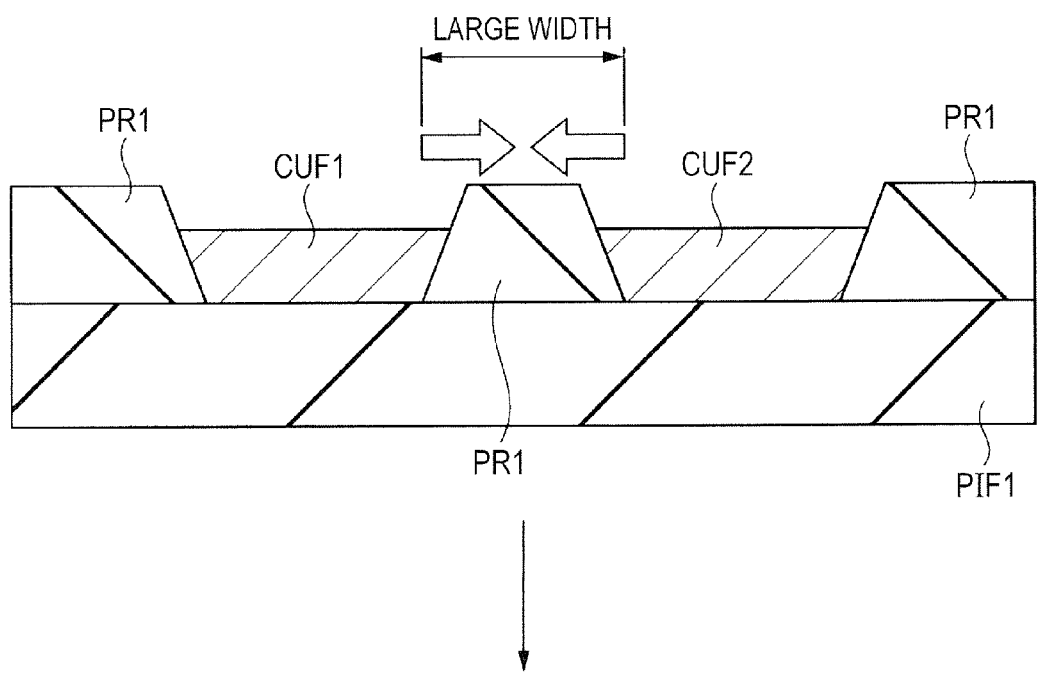
FIG. 5A is a cross-sectional view showing two adjacent copper films formed using a patterned resist film and FIG. 5B is a cross-sectional view after removal of the resist film after the step FIG. 5A.
Figure 5B:
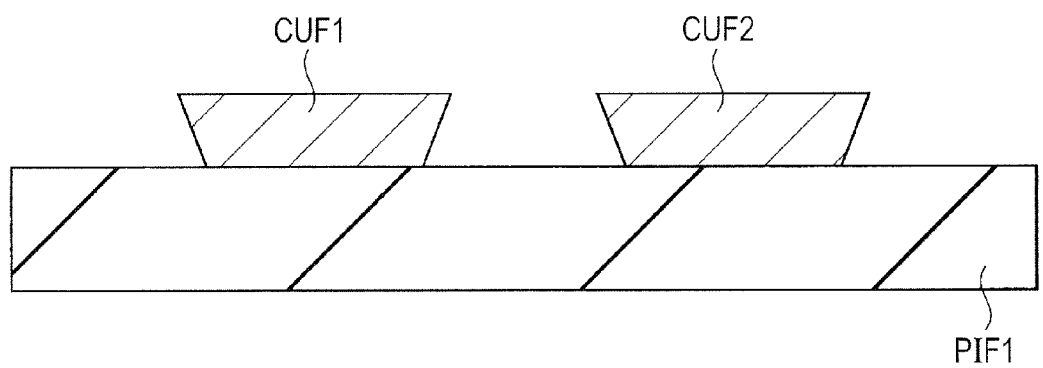

The finding by the present inventors will be described referring to some drawings. FIG. 5 show formation of two adjacent copper films CUF1 and CUF2 by using a patterned resist film PR1. In particular, FIG. 5 show a schematic view showing a configuration in which a distance between the copper film CUF1 and the copper film CUF2 is large and therefore, the width of the resist film PR1 sandwiched between the copper film CUF1 and the copper film CUF2 becomes large. FIG. 5A is a cross-sectional view showing the copper film CUF1 and the copper film CUF2 formed using a patterned resist film PR1, while FIG. 5B is a cross-sectional view after removal of the resist film PR1 after the step of FIG. 5A. First, in FIG. 5A, the patterned resist film PR1 is subjected to curing treatment by exposure to ultraviolet rays and then, shrinkage of the resist film PR1 occurs. In particular, as shown in FIG. 5A, as the width of the resist film PR1 sandwiched between the copper film CUF1 and the copper film CUF2 becomes large, an absolute amount of shrinkage at the surface (upper surface) of the resist film PR1 becomes large. An increase in the shrinkage at the surface of the resist film PR1 means an increase in the taper degree of the resist film PR1. In this case, therefore, as shown in FIG. 5B, the removal of the patterned resist film PR1 greatly increases the inverted taper degree of the side surface of the copper film CUF1 and at the same time, greatly increases the inverted taper degree of the side surface of the copper film CUF2. This means that with an increase in the width of the resist film PR1 sandwiched between the copper film CUF1 and the copper film CUF2, the inverted taper degree of the copper film CUF1 and the copper film CUF2 increases greatly. For example, it has been verified as a result of the research by the present inventors that when the space between the copper film CUF1 and the copper film CUF2 is about 260 μm (the width of the resist film PR1 sandwiched between the copper film CUF1 and the copper film CUF2 is about 260 μm), the upper portion of the copper film CUF1 (copper film CUF2) protrudes outward by about 1.2 μm, on one side, from the lower portion.

Figure 6A:
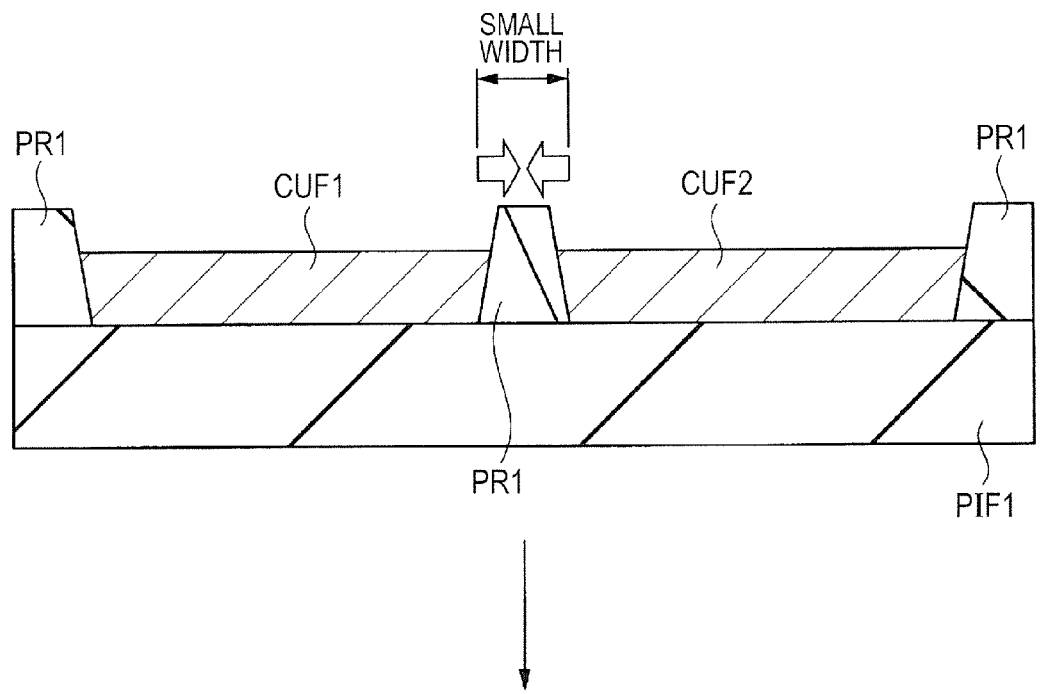
FIG. 6A is a cross-sectional view showing two adjacent copper films formed using a patterned resist film and FIG. 6B is a cross-sectional view after removal of the resist film after the step of FIG. 6A.
Figure 6B:
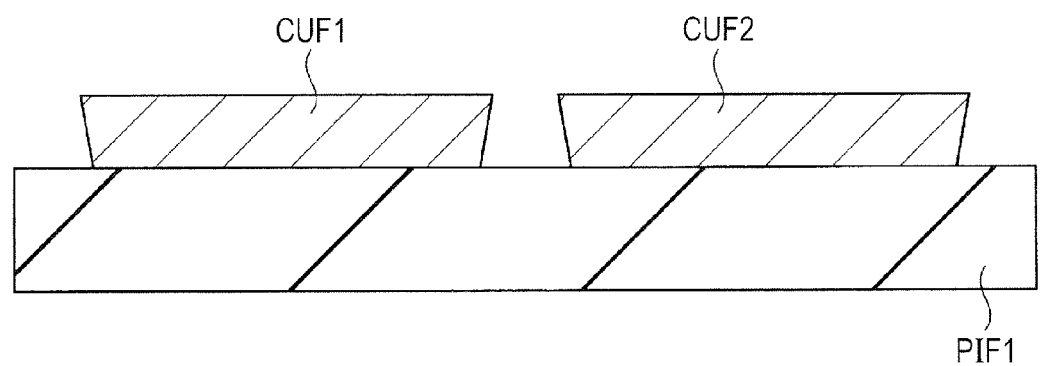

On the other hand, FIG. 6 are each a schematic view showing a configuration in which a distance between the copper film CUF1 and the copper film CUF2 is small and therefore, the width of the resist film PR1 sandwiched between the copper film CUF1 and the copper film CUF2 decreases. FIG. 6A is a cross-sectional view of the copper film CUF1 and the copper film CUF2 formed using the patterned resist film PR1, while FIG. 6B is a cross-sectional view showing after removal of the resist film PR1 after the step of FIG. 6A.

As shown in FIG. 6A, with a decrease in the width of the resist film PR1 sandwiched between the copper film CUF1 and the copper film CUF2, an absolute amount of shrinkage at the surface (upper surface) of the resist film PR1 decreases. In this case, as shown in FIG. 6B, an inverted taper degree of the side surface of the copper film CUF1 is suppressed and also an inverted taper degree of the side surface of the copper film CUF2 is suppressed. This means that with a decrease in the width of the resist film PR1 sandwiched between the copper film CUF1 and the copper film CUF2, an inverted taper degree of the copper film CUF1 and the copper film CUF2 is suppressed. According to the novel finding by the present inventors, with a decrease in the width of the resist film PR1 sandwiched between the copper film CUF1 and the copper film CUF2, an inverted taper degree of the copper film CUF1 and the copper film CUF2 is suppressed.

<Control Strategy>

Figure 7A:
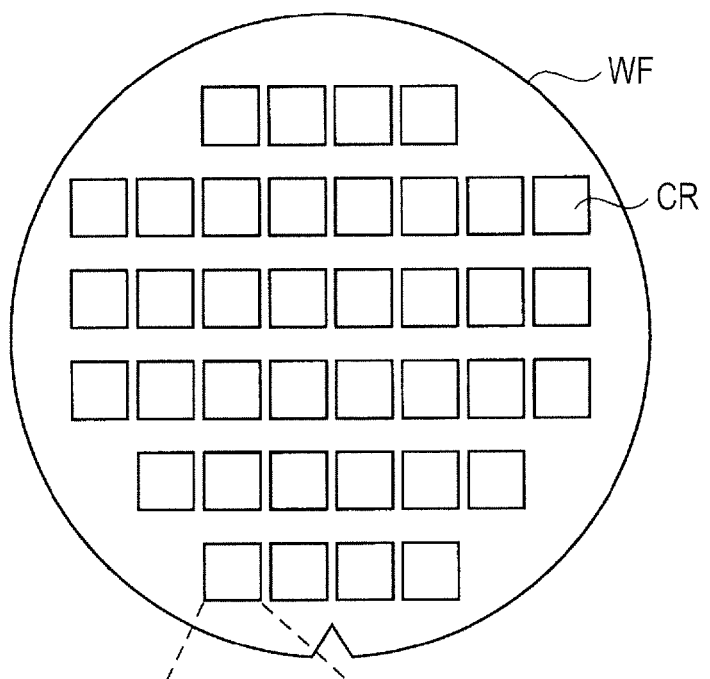
FIG. 7A shows a planar configuration of a semiconductor wafer and FIG. 7B is an enlarged schematic view of its chip region.

Here, a control strategy for actualizing the above-described finding will be described. FIG. 7A shows a planar configuration of a semiconductor wafer WF. As shown in FIG. 7A, the semiconductor wafer WF has a substantially disc-shaped planar shape and it has inside thereof a plurality of chip regions CR. These chip regions CR will be individual semiconductor chips by dicing the semiconductor wafer WF.

Figure 7B:
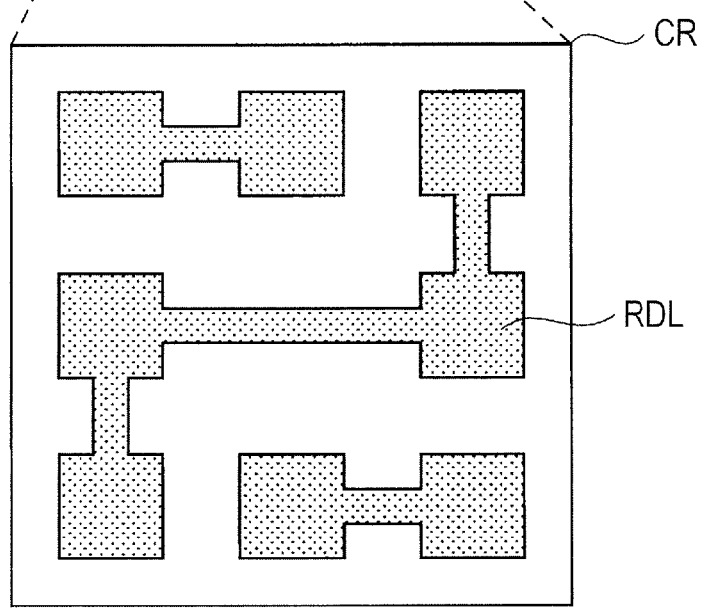

Next, FIG. 7B is an enlarged schematic view of the chip region CR. As shown in FIG. 7B, the chip region CR has a rectangular shape and it has, in the inner surface region thereof, rewirings RDL. In FIG. 7B, a distance (space) between the wirings RDL is wide, meaning that the shrinkage of a resist film used for the formation of the rewiring RDL becomes large and the resist film sandwiched between the rewirings RDL has a tapered side surface. In this case, the rewiring RDL has an inverted tapered surface and the bonding film at the side surface of the rewiring RDL becomes thin. This may lead to peeling of the bonding film or generation of foreign matters due to this film peeling. The semiconductor device may presumably have deteriorated reliability or be manufactured at a reduced manufacturing yield.

Figure 8:
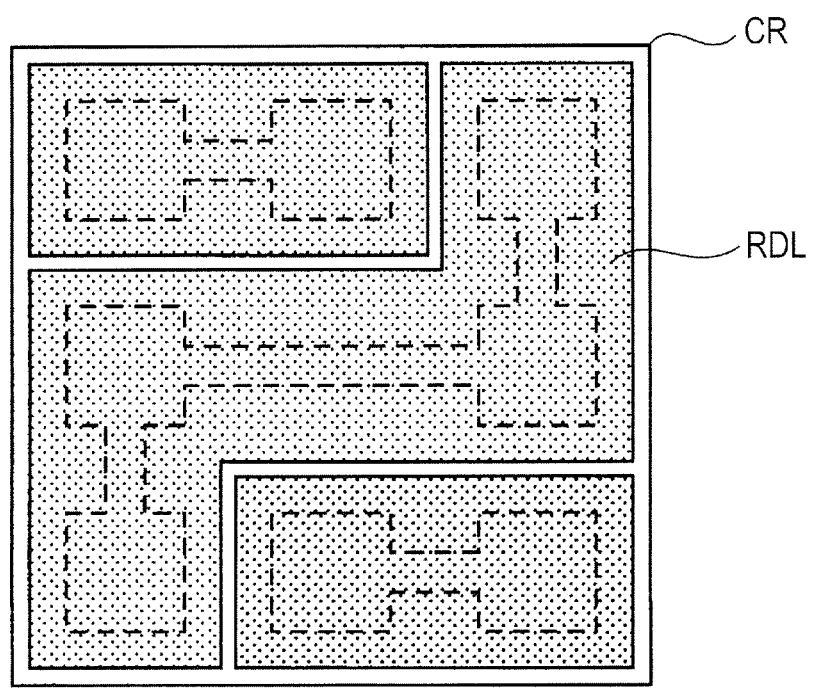
FIG. 8 is a schematic view showing the configuration of a control strategy.

In this point, according to the control strategy, a configuration shown below is actualized based on a concept of minimizing the width of the resist film sandwiched between the rewirings RDL. Specifically, FIG. 8 is a schematic view showing the configuration of the control strategy. As shown in FIG. 8, in the control strategy, the configuration intended to increase the width of the rewirings RDL formed in a surface region of the chip region CR is actualized. According to the configuration of this control strategy, a space sandwiched between the rewirings RDL can be narrowed. This means that in the control strategy, the width of the resist film sandwiched between the rewirings RDL can be reduced when the rewirings RDL are formed. According to the control strategy, therefore, an inverted tapered degree of the rewirings RDL can be suppressed.

Although the inverted taper degree of the rewirings RDL can be suppressed in the configuration according to the control strategy, another room for improvement becomes apparent. Next, the another room for improvement will be described.

As shown in FIG. 8, according to the control strategy, the distance between the rewirings RDL is reduced by increasing the width of the rewirings RDL. This means a marked increase in an area occupied by the rewirings RDL in the chip region CR. This causes the following inconvenience. In the semiconductor wafer WF shown in FIG. 7A, before the dicing step to divide the chip region CR into individual chips, the back surface of the semiconductor wafer WF is ground to thin the semiconductor wafer WF. As shown in FIG. 8, when the area occupied by the rewirings RDL at the surface of each of the chip regions CR is large, the semiconductor wafer WF warps due to a difference in linear expansion coefficient between silicon, a main component of the semiconductor wafer WF, and copper, a main constituent material of the rewirings RDL. Such a warp may interfere with fabrication steps thereafter including the dicing step. In the control strategy, therefore, the inverted taper degree can be suppressed, while new room for improvement, that is, warp of the semiconductor wafer due to an increase in the area of the chip region CR occupied by the rewirings RDL becomes apparent. This has revealed that the control strategy is not sufficient resolution because it causes another side effect, that is, warp of the semiconductor wafer WF. Next, the technical concept of First Embodiment will therefore be described.

<Planar Layout Configuration of Semiconductor Chip in First Embodiment>

Figure 9:
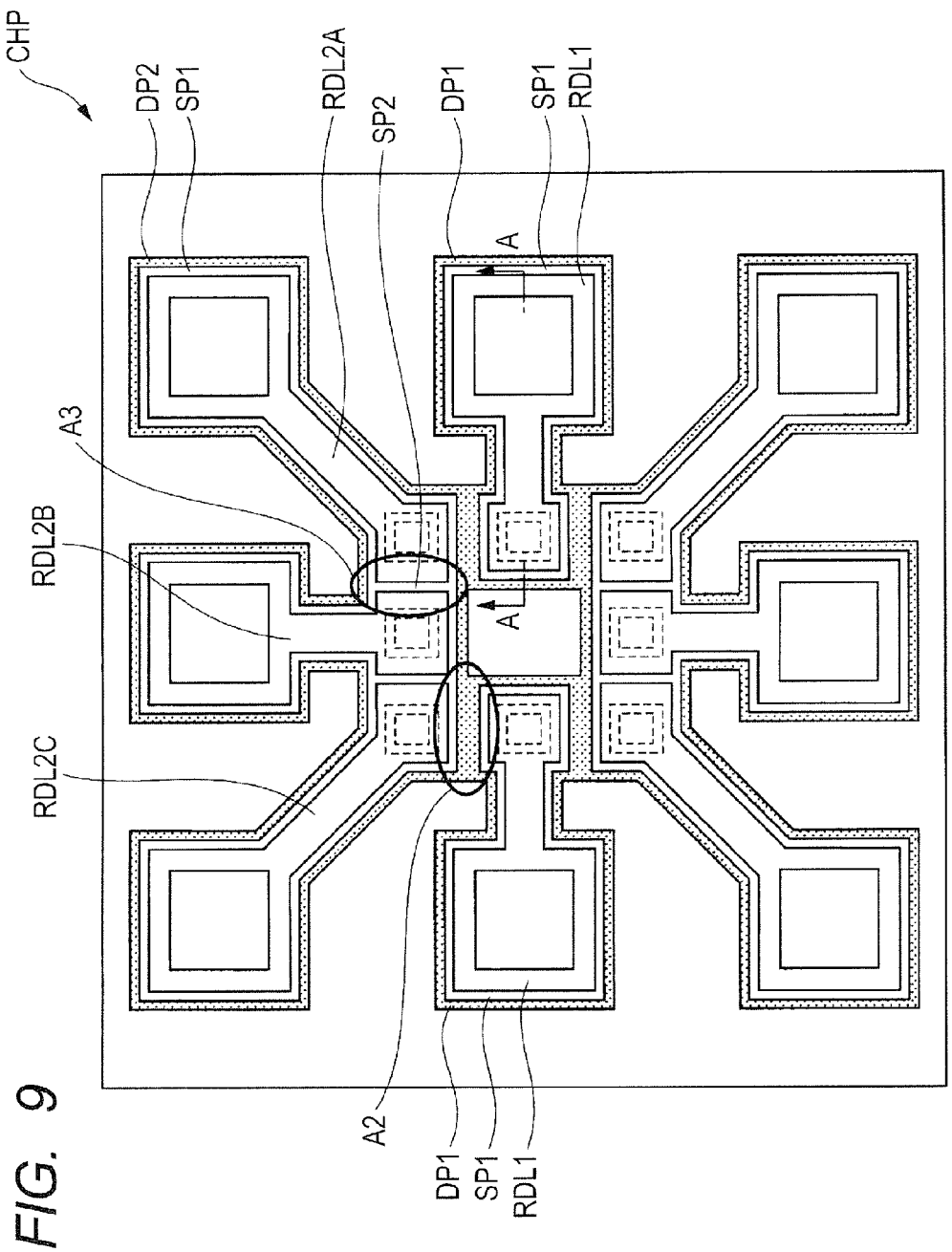
FIG. 9 shows the layout configuration of a semiconductor chip in First Embodiment.

First, the planar layout configuration of a semiconductor chip in First Embodiment will be described. FIG. 9 shows the planar layout configuration of a semiconductor chip CHP in First Embodiment. As shown in FIG. 9, the semiconductor chip CHP in First Embodiment has, in plan view, a rectangular shape. The semiconductor chip CHP has, on the surface thereof, a rewiring RDL1 and the rewiring RDL1 is, in plan view, surrounded by a dummy pattern DP1. As shown in FIG. 9, the dummy pattern DP1 is comprised of a closed pattern surrounding, in plan view, the rewiring RDL1 while having a space SP1 therebetween.

Similarly, the semiconductor chip CHP has, on the surface thereof, rewirings RDL2A, RDL2B, and RDL2C and in plan view, a dummy pattern DP2 surrounds these rewirings RDL2A, RDL2B, and RDL2C. At this time, as shown in FIG. 9, the dummy pattern DP2 is comprised of a closed pattern surrounding the rewirings RDL2A, RDL2B, and RDL2C, while having a space SP1 therebetween.

With respect to the rewiring RDL1 and the dummy pattern DP1, the rewiring RDL1 and the dummy pattern DP1 have therebetween a substantially fixed distance. In other words, the space SP1 inserted between the rewiring RDL1 and the dummy pattern DP1 is substantially fixed. Similarly, for example, with respect to the rewirings RDL2A, RDL2B, and RDL2C and the dummy pattern DP2, the space SP1 inserted between the rewirings RDL2A, RDL2B, and RDL2C and the dummy pattern DP2 is substantially fixed. In particular, the dummy pattern DP2 is comprised of a closed pattern surrounding a plurality of rewirings (the rewirings RDL2A, RDL2B, and RDL2C). In this case, there is the space SP1 between the dummy pattern DP2 and the rewirings RDL2A, RDL2B, and RDL2C and at the same time, as shown for example in a region A3 of FIG. 9, there is a space SP2 between the rewiring RDL2A and the rewiring RDL2B. In First Embodiment, the space SP1 and the space SP2 are roughly equal to each other.

Further, as shown in a region A2 of FIG. 9, the dummy pattern DP1 and the dummy pattern DP2 are coupled to each other and the width of a coupled portion of the dummy pattern DP1 and the dummy pattern DP2 is greater than the width of the other portion of the dummy pattern DP1 and the width of the other portion of the dummy pattern DP2.

The dummy pattern DP1 and the dummy pattern DP2 having such a configuration are patterns not functioning as a wiring and, for example, the potential of the dummy pattern DP1 and the potential of the dummy pattern DP2 are a floating potential.

<Cross-Sectional Configuration of Semiconductor Chip in First Embodiment>

Figure 10:
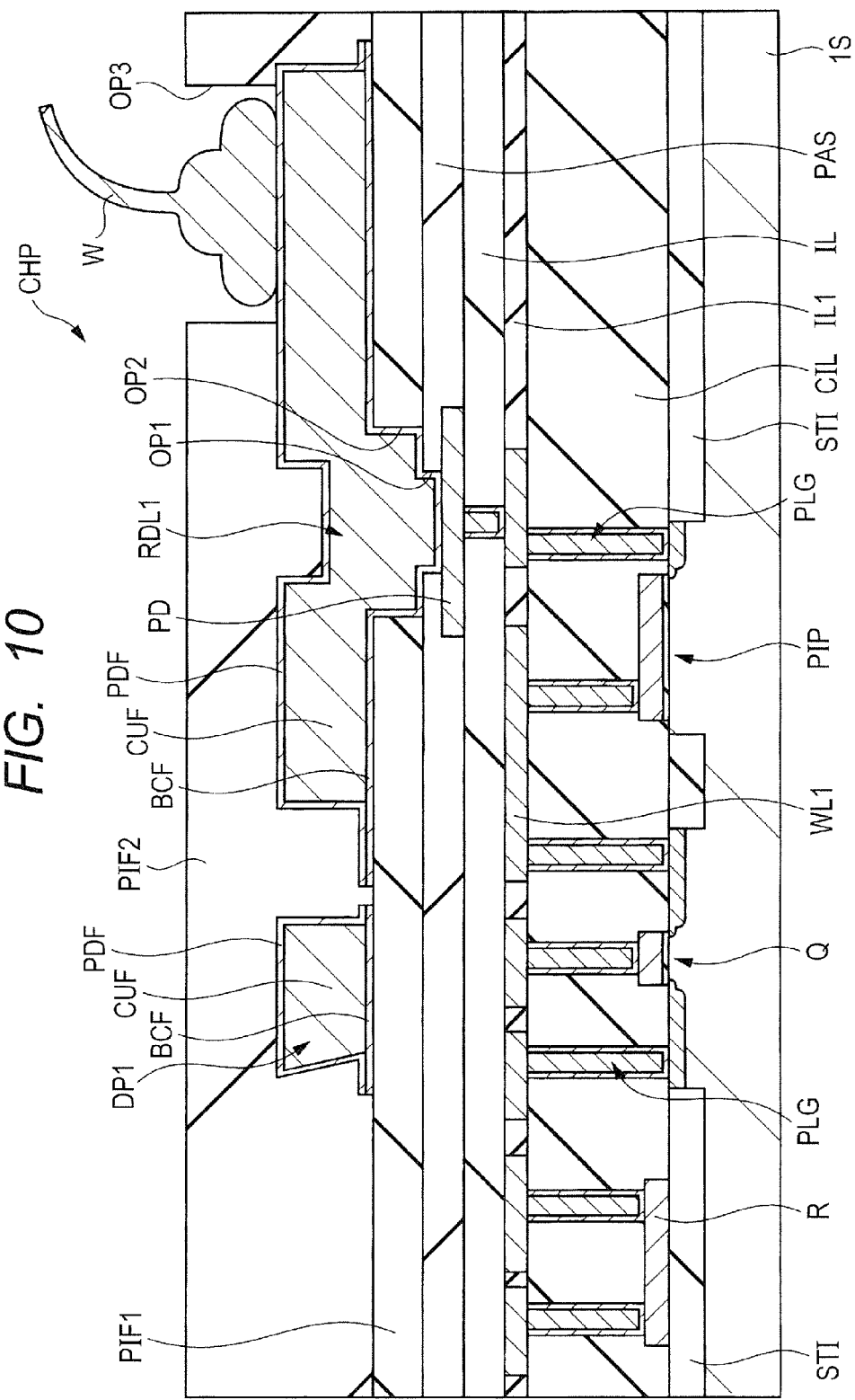
FIG. 10 is a cross-sectional view taken along the line A-A of FIG. 9.

FIG. 10 is a cross-sectional view taken along the line A-A of FIG. 9. In FIG. 10, the semiconductor chip CHP in First Embodiment has a semiconductor substrate 1S made of, for example, silicon and the semiconductor substrate 1S has, in the surface thereof, an element isolation region STI. An active region partitioned by the element isolation region STI has thereon a field effect transistor Q and a capacitive element PIP. The element isolation region STI has thereon a resistive element R. The surface of the semiconductor substrate 1S having thereon the field effect transistor Q, capacitive element PIP, and the resistive element R is covered with a contact interlayer insulating film CIL made of, for example, a silicon oxide film. This contact interlayer insulating film CIL has therein a plug PLG that penetrates through the contact interlayer insulating film CIL. This plug PLG is formed by filling, for example, a contact hole with a barrier conductor film and a tungsten film.

The contact interlayer insulating film CIL having a plug PL therein has thereon an interlayer insulating film IL1 made of, for example, a silicon oxide film or a low dielectric constant film having a dielectric constant lower than that of a silicon oxide film. The interlayer insulating film IL1 has therein a wiring trench and this wiring trench is filled with a wiring WL1 comprised of, for example, a copper wiring.

Next, as shown in FIG. 10, the interlayer insulating film IL1 having therein the wiring WL1 has thereon an interlayer insulating film IL made of, for example, a silicon oxide film or a low dielectric constant film. This interlayer insulating film IL has thereon a pad PD. This pad PD is comprised of, for example, an aluminum film (Al film) or an aluminum alloy film (AlSi film, AlSiCu film, or the like). The semiconductor chip CHP in First Embodiment has a rewiring structure above the pad PD. The rewiring structure will next be described referring to FIG. 10.

In FIG. 10, the pad PD is covered with a surface protection film (passivation film) PAS made of, for example, a silicon oxide film or a silicon nitride film and this surface protection film PAS has therein an opening portion OP1 from which a portion of the surface of the pad PD is exposed. The surface protection film PAS having therein the opening portion OP1 has thereon a polyimide film PIF1 and this polyimide film PIF1 has therein an opening portion OP2 which couples with the opening portion OP1. A rewiring RDL1 fills the opening portion OP1 and the opening portion OP2 and is allocated on the polyimide film PIF1. The rewiring RDL1 is comprised of, for example, a barrier conductor film BCF made of a titanium film or a titanium nitride film, a copper film CUF formed on the barrier conductor film BCF, and a stacked film PDF covering the surface and the side surface of the copper film CUF. In particular, the stacked film PDF is made of, for example, a titanium film and a palladium film formed thereon.

The polyimide film PIF1 has thereon the dummy pattern DP1 adjacent to the rewiring RDL1. This means that the polyimide film PIF1 has thereon the rewiring RDL1 and the dummy pattern DP1 adjacent to each other and the rewiring RDL1 and the dummy pattern DP1 are placed in the same layer. The dummy pattern DP1 is also comprised of a barrier conductor film BCF, a copper film CUF formed on the barrier conductor film BCF, and a stacked film (Ti/Pd film) PDF that covers the surface and the side surface of the copper film CUF. The dummy pattern DP1 can therefore be called a conductor pattern.

The rewiring RDL1 and the dummy pattern DP1 placed adjacent to each other are covered by a polyimide film PIF2. This polyimide film PIF2 has therein an opening portion OP3 that exposes a portion of the rewiring RDL1. More specifically, as shown in FIG. 10, the stacked film (Ti/Pd film) PDF formed on the surface of the rewiring RDL1 is exposed from the opening portion OP3 formed in the polyimide film PIF2 and a wire W made of copper is coupled to the stacked film (Ti/Pd film) PDF exposed from the opening portion OP3.

The barrier conductor film BCF has a function of suppressing diffusion of copper configuring the copper film CUF. The stacked film (Ti/Pd film) PDF functions as a bonding film for improving adhesion between the rewiring RDL1 and the wire W made of copper.

<Characteristic of First Embodiment>

The semiconductor chip CHP in First Embodiment has a configuration as described above. The characteristics of the present embodiment will next be described. First Embodiment is characterized in that, for example, as shown in FIG. 9, the dummy pattern DP1 is provided so as to surround the periphery of the rewiring RDL1, while having the space SP1 therebetween. In other words, the characteristic of First Embodiment is that the dummy pattern DP1 is provided which is comprised of a closed pattern surrounding, in plan view, the rewiring RDL1, while having the space SP1 therebetween. When the rewiring RDL1 is formed, the dummy pattern DP1 surrounding the rewiring RDL1 is formed together. This means that simultaneously with an opening portion for forming the wiring, forming the rewiring RDL1 in the resist film, an opening portion for forming a dummy pattern, forming the dummy pattern DP1 is formed in the vicinity of the opening portion for forming the wiring. Due to the characteristic of First Embodiment, therefore, the width of the resist film present between the opening portion for forming the wiring and the opening portion for forming the dummy pattern can be reduced. As a result, First Embodiment enables reduction in an absolute amount of shrinkage at the surface of the resist film, which is sandwiched between the rewiring RDL1 and the dummy pattern DP1, by curing treatment. In other words, according to the characteristic of First Embodiment, the tapered shape of the opening portion for forming the wiring, formed in the resist film can be relaxed to suppress the rewiring RDL1 from having an inverted tapered side surface. According to the characteristic of First Embodiment, therefore, thinning of the bonding film at the side surface of the rewiring RDL1, which results from that the rewiring RDL1 has an inverted tapered side surface, can be suppressed. According to First Embodiment, peeling of the bonding film or generation of foreign matters due to this film peeling can be suppressed and as a result, the semiconductor device thus obtained can have improved reliability and it can be manufactured at an improved yield.

In particular, according to the characteristic of First Embodiment, a concept of reducing the width of the resist film, which has been described in the finding by the present inventors (refer to FIG. 6), is realized not by reducing the distance between two adjacent rewirings but by forming the closed dummy pattern DP1 that surrounds the rewiring RDL1 while having the space SP1 therebetween.

For example, as shown in FIG. 6, when the concept of reducing the width of a resist film sandwiched between two adjacent rewirings is realized by the configuration for reducing a distance between two adjacent rewirings, a drastic change in the layout of the rewiring is required and at the same time, excessive limitation is imposed on the layout of the rewiring in order to reduce the distance between two adjacent rewirings. Further, as in the control strategy shown in FIG. 8, an area occupied by the rewiring becomes markedly large and warp of the semiconductor wafer appears as a problem. When the concept of reducing the width of a resist film sandwiched between two adjacent rewirings is realized by the configuration for reducing a distance between two adjacent rewirings, it is accompanied with a drastic design change of the layout of the rewiring, excessive limitation in layout design, and moreover, a side effect such as warp of a semiconductor wafer as compensation for suppression of the inverted taper degree of the rewiring RDL1.

On the other hand, in the configuration as described in the characteristic of First Embodiment in which the width of the resist film sandwiched between the rewiring RDL1 and the dummy pattern DP1 is reduced by forming the closed dummy pattern DP1 surrounding the rewiring RDL1 while having the space SP1 therebetween, the rewiring RDL1 can be suppressed from having an inverted tapered shape without drastic design change in the layout of the rewiring or excessive limitation in the layout design. Further, according to the characteristic of First Embodiment, a remarkable increase in the area occupied by the rewiring RDL1 as in the control strategy shown in FIG. 8 can be prevented so that the warp of the semiconductor wafer does not appear as a problem. In short, when the finding by the present inventors is realized based on the characteristic of First Embodiment, the inverted taper degree of the rewiring RDL1 can be suppressed without causing a side effect so that it is a highly useful technical concept.

Further, in First Embodiment, the space SP1 between the rewiring RDL1 and the dummy pattern DP1 is substantially fixed throughout the rewiring RDL1 so that the resist film sandwiched between the rewiring RDL1 and the dummy pattern DP1 can have a uniform width throughout the rewiring RDL1. This means that the rewiring RDL1 can be suppressed from having an inverted tapered shape uniformly all over the rewiring RDL1. In other words, it is possible to suppress a portion of the rewiring RDL1 from having an inverted tapered shape and thereby suppress thinning of a bonding film which will otherwise occur when the rewiring RDL1 has an inverted tapered side surface all over the rewiring RDL1.

The First Embodiment is also characterized in that for example, as shown in FIG. 9, the dummy pattern DP2 surrounds, via the space SP1, the periphery of the entirety of a rewiring group comprised of the rewiring RDL2A, RDL2B, and RDL2C. This means that another characteristic of First Embodiment is that the dummy pattern DP2 comprised of a closed pattern that surrounds, in plan view, the entirety of the rewiring group (rewirings RDL2A, RDL2B, and RDL2C) via the space SP1 is provided. Essentially, according to the characteristic of First Embodiment, it is assumed that one dummy pattern DP1 surrounds the periphery of one rewiring RDL1 via the space SP1. There is however a case where, for example as shown in the region A3 of FIG. 9, a distance between the rewiring RDL2A and the rewiring RDL2B is narrow and the dummy pattern DP1 is hardly be placed in this narrow region via the space SP1. To overcome such a case, providing the dummy pattern DP2 via the space SP1 so as to surround the periphery of the entirety of the rewiring group comprised of the rewirings RDL2A, RDL2B, and RDL2C as shown in FIG. 9 is considered. As a result, according to First Embodiment, even when it is difficult to provide one dummy pattern DP1 via the space SP1 so as to surround the periphery of one rewiring RDL1, the dummy pattern DP2 can be placed via the space SP1 for the entirety of the rewiring group comprised of the rewirings RDL2A, RDL2B, and RDL2C. This makes it possible to make uniform the width of the resist film sandwiched between the entirety of the rewiring group comprised of the rewirings RDL2A, RDL2B, and RDL2C and the dummy pattern DP2 throughout the entirety of the rewiring group. This means that an inverted taper degree of the rewirings RDL2A, RDL2B, and RDL2C in the rewiring group can be suppressed uniformly throughout the entirety of the rewiring group. In particular, by making, for example the space SP2 between the rewiring RDL2A and the rewiring RDL2B in the region A3 shown in FIG. 9 equal to the space SP1 between the rewiring group and the dummy pattern DP2, not only the uniformity of the width of the resist film (corresponding to the width of the space SP1) sandwiched between the entirety of the rewiring group and the dummy pattern DP2 but also the uniformity of the width (corresponding to the width of the space SP2) of the resist film sandwiched between the rewiring groups can be enhanced. Further, the width of the space SP1 between the rewiring RDL1 and the dummy pattern DP1 is made equal to the width of the space SP1 between the rewiring group (rewirings RDL2A, RDL2B, and RDL2C) and the dummy pattern DP2. This makes it possible to enhance the uniformity of the width of the resist film sandwiched between the rewirings (RDL1, RDL2A, RDL2B, and RDL2C) and the dummy patterns (DP1 and DP2) throughout the entirety of the rewirings formed on the semiconductor chip. As a result, according to the characteristic of First Embodiment, thinning of the bonding film resulting from the inverted tapered side surface of the rewirings (RDL1, RDL2A, RDL2B, and RDL2C) formed on the semiconductor chip CHP can be suppressed throughout the rewirings (RDL1, RDL2A, RDL2B, and RDL2C). According to the characteristic of First Embodiment, therefore, peeling of the bonding film or generation of foreign matters due to film peeling can be suppressed. The semiconductor device thus obtained can therefore have improved reliability and it can be manufactured at an improved yield.

<Method of Manufacturing Semiconductor Device According to First Embodiment>

Figure 11:
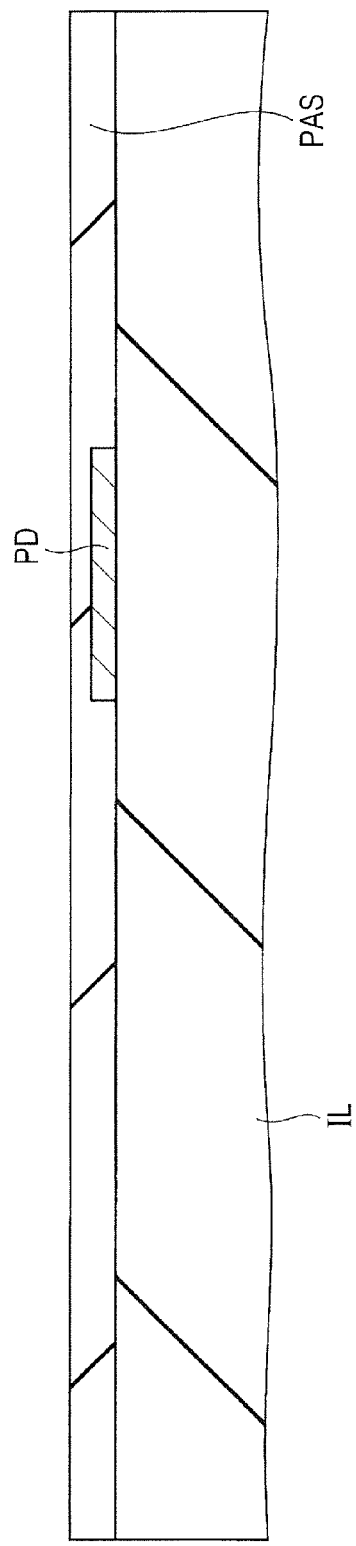
FIG. 11 is a cross-sectional view showing a manufacturing step of a semiconductor device of First Embodiment.

Next, a method of manufacturing a semiconductor device according to First Embodiment will be described referring to drawings. First, a semiconductor substrate (semiconductor wafer) made of, for example, silicon is provided and semiconductor elements typified by a plurality of field effect transistors are formed on the semiconductor substrate. A multilayer wiring layer is then formed on the semiconductor substrate having thereon the field effect transistors. FIG. 11 shows an interlayer insulating film IL formed on the uppermost layer of the multilayer wiring layer. As shown in FIG. 11, a conductor film made of, for example, an aluminum film or aluminum alloy film (AlSi film, AlSiCu film, or the like) is formed on the interlayer insulating film IL. By using photolithography and etching, the conductor film is patterned into a pad PD.

Figure 12:
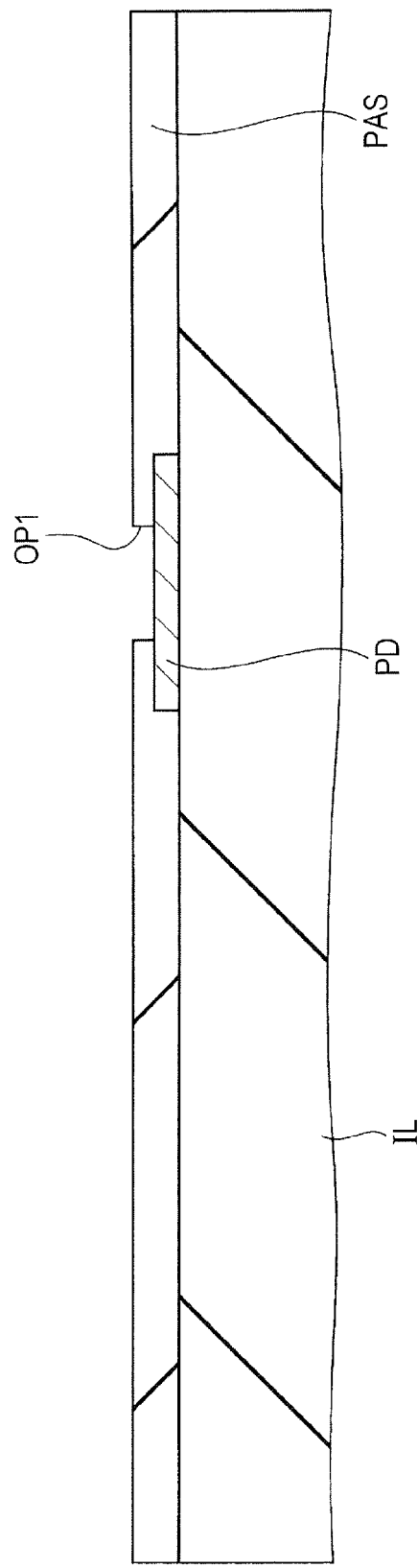
FIG. 12 is a cross-sectional view showing a manufacturing step of the semiconductor device following that of FIG. 11.

A surface protection film PAS is then formed on the interlayer insulating film IL that covers the pad PD. The surface protection film PAS is made of, for example, a silicon oxide film or a silicon nitride film and it can be formed using, for example, CVD (chemical vapor deposition). As shown in FIG. 12, by using photolithography and etching, an opening portion OP1 is then formed in the surface protection film PAS. At this time, a partial region of the pad PD is exposed from the bottom surface of the opening portion OP1.

Figure 13:
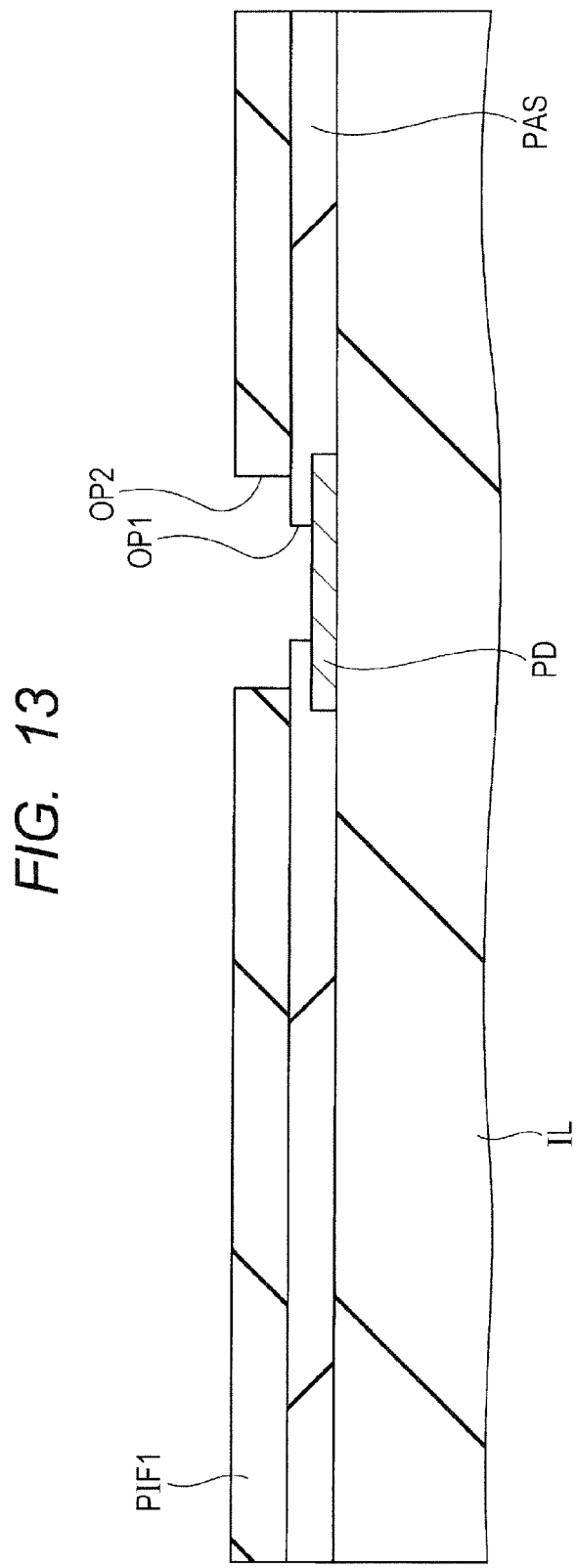
FIG. 13 is a cross-sectional view showing a manufacturing step of the semiconductor device following that of FIG. 12.

As shown in FIG. 13, after formation of a polyimide film PIF1 having photosensitivity on the surface protection film PAS having therein the opening portion OP1, an opening portion OP2 is formed in the polyimide film PIF1 by photolithography. This opening portion OP2 couples with the opening portion OP1 formed in the surface protection film PAS.

Figure 14:
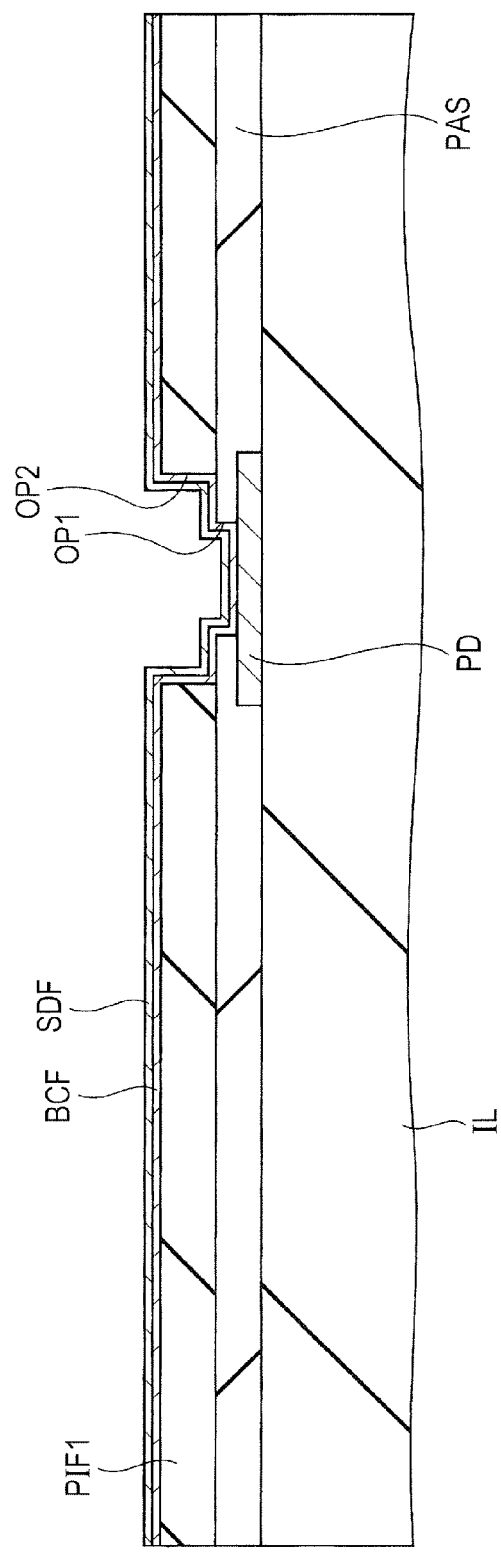
FIG. 14 is a cross-sectional view showing a manufacturing step of the semiconductor device following that of FIG. 13.

Next, as shown in FIG. 14, a barrier conductor film BCF is formed on the polyimide film PIF1 including the inner wall of the opening portion OP1 and the inner wall of the opening portion OP2. This barrier conductor film BCF is made of, for example, a titanium film or a titanium nitride film and it can be formed, for example, by sputtering. A seed film SDF made of a copper film is then formed on the barrier conductor film BCF, for example, by sputtering.

Figure 15:
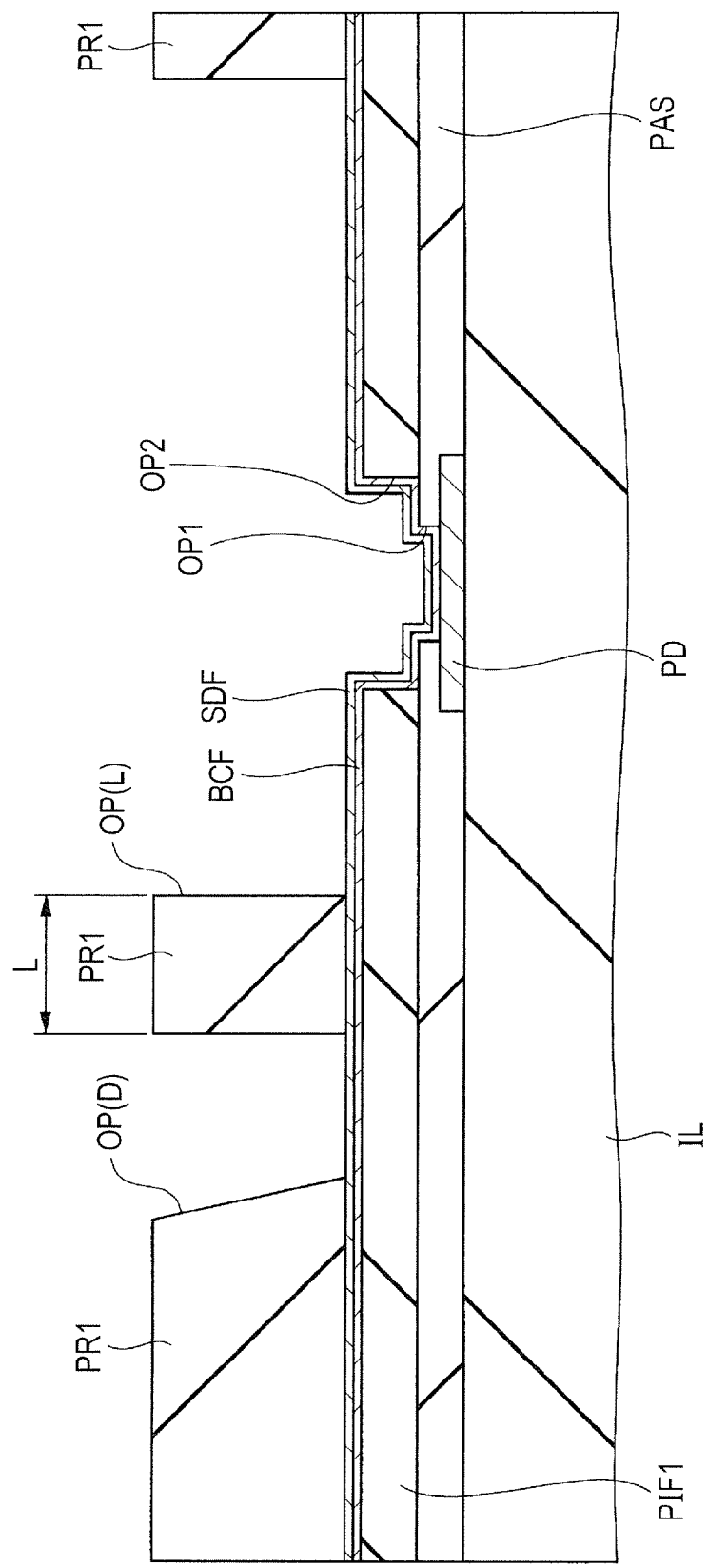
FIG. 15 is a cross-sectional view showing a manufacturing step of the semiconductor device following that of FIG. 14.

Then, as shown in FIG. 15, after formation of a resist film PR1 on the seed film SDF, the resist film PR1 is patterned by photolithography. Patterning of the resist film PR1 is performed so as to form an opening in a rewiring formation region. More specifically, in First Embodiment, an opening portion OP(L) for forming a wiring and an opening portion OP(D) for forming a dummy pattern are formed in the resist film PR1 as shown in FIG. 15. Since the opening portion OP(L) for forming the wiring and the opening portion OP(D) for forming the dummy pattern are placed to be close to each other, a width L of the resist film PR1 sandwiched between the opening portion OP(L) for forming the wiring and the opening portion OP(D) for forming the dummy pattern becomes small. Then, the resist film PR1 is cured by curing treatment through exposure of the patterned resist film PR1 to ultraviolet rays. At this time, the surface of the resist film PR1 is likely to shrink, but the width L of the resist film PR1 sandwiched between the opening portion OP(L) for forming the wiring and the opening portion OP(D) for forming the dummy pattern is small so that an absolute amount of shrinkage of surface of the resist film PR1 can be reduced. As a result, according to First Embodiment, the opening portion OP(L) for forming the wiring is suppressed from having a tapered side surface.

Figure 16:
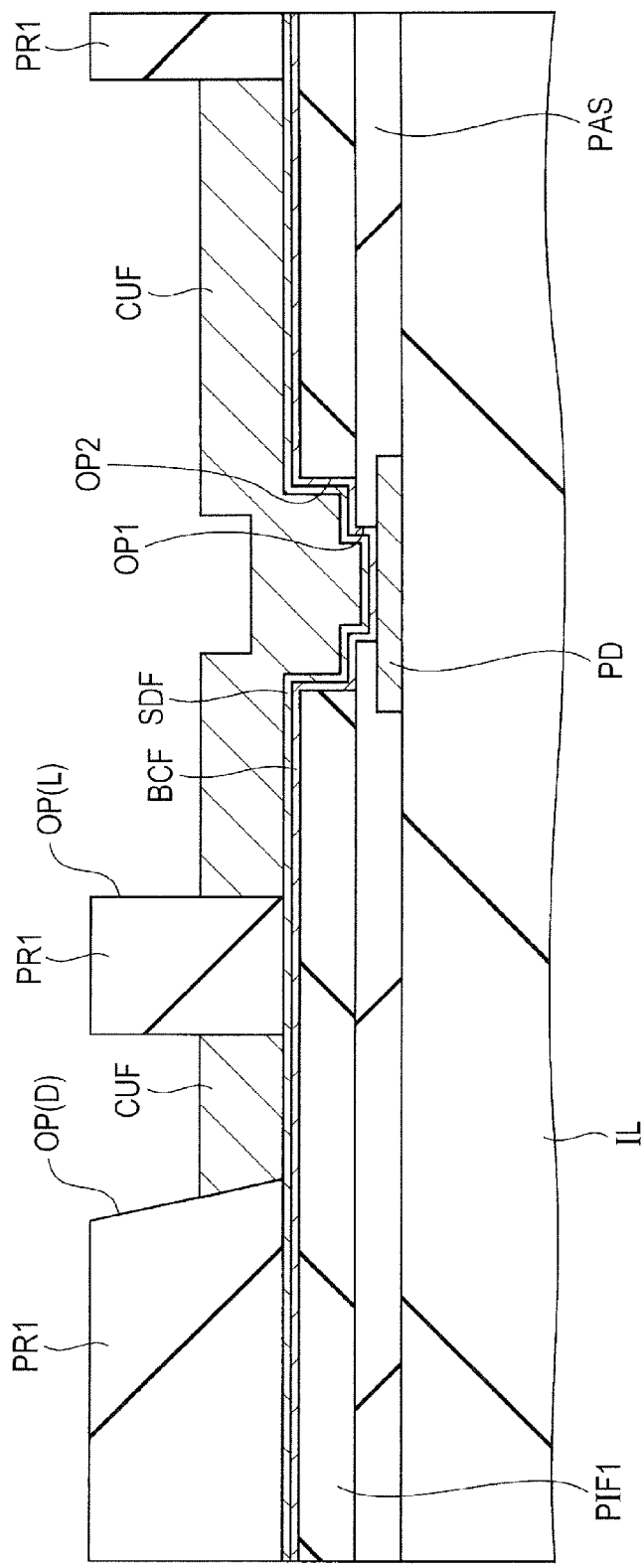
FIG. 16 is a cross-sectional view showing a manufacturing step of the semiconductor device following that of FIG. 15.

As shown in FIG. 16, by using, for example, electroplating, a copper film CUF that fills the opening portion OP1, the opening portion OP2, and the opening portion OP(L) for forming the wiring via the barrier conductor film BCF and is allocated over the polyimide film PIF1 is formed and at the same time, a copper film CUF that fills the opening portion OP(D) for forming the dummy pattern and is allocated over the polyimide film PIF1 is formed. At this time, in First Embodiment, the opening portion OP(L) for forming the wiring is suppressed from having a tapered side surface so that the copper film CUF with which the opening portion OP(L) for forming the wiring is filled is suppressed from having an inverted tapered side surface.

Figure 17:
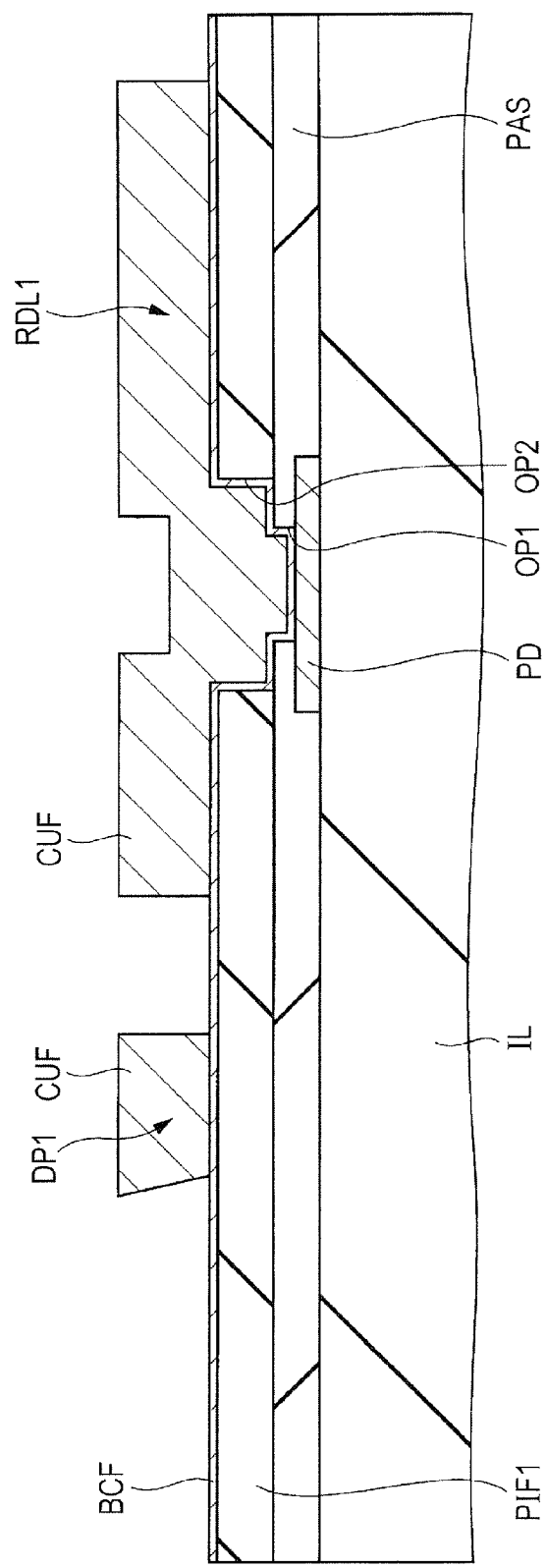
FIG. 17 is a cross-sectional view showing a manufacturing step of the semiconductor device following that of FIG. 16.

Next, as shown in FIG. 17, the patterned resist film PR1 is removed and then, the seed film SDF exposed by the removal of the resist film PR1 is removed. This enables formation of the rewiring RDL1 and the dummy pattern DP1 adjacent to each other. At this time, the dummy pattern DP1 is comprised of a closed pattern surrounding, in plan view, the rewiring RDL1, while having a space therebetween (Refer to FIG. 9).

In the drawings of FIG. 17 and thereafter, the copper film CUF and the seed film SDF lying below the copper film CUF will be expressed as one film, that is, the copper film CUF.

Figure 18:
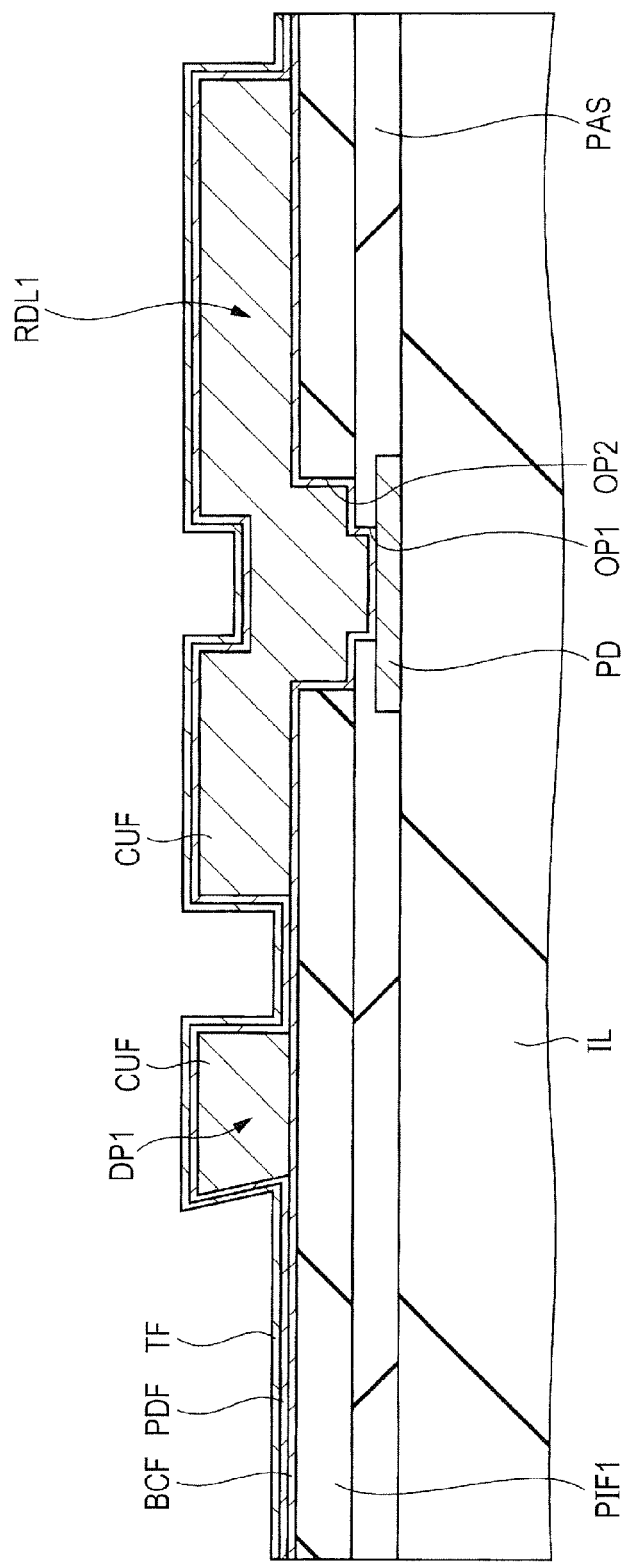
FIG. 18 is a cross-sectional view showing a manufacturing step of the semiconductor device following that of FIG. 17.

Next, as shown in FIG. 18, a stacked film PDF is formed on the surface and the side surface of the rewiring RDL1 and the surface and the side surface of the dummy pattern DP1, for example, by sputtering, followed by formation of a titanium film TF on this stacked film PDF. The stacked film PDF can be comprised of, for example, a titanium film and a palladium film on the titanium film. In First Embodiment, since the rewiring RDL1 (copper film CUF) is suppressed from having an inverted tapered side surface, thinning of the stacked film PDF and the titanium film TF formed on the side surface of the rewiring RDL1 can be suppressed. This means that even when sputtering having directivity is used for the formation of the stacked film PDF and the titanium film TF, the stacked film PDF and the titanium film TF formed on the side surface of the rewiring RPDL1 can have a thickness equal to that of these films on the surface.

Figure 19:
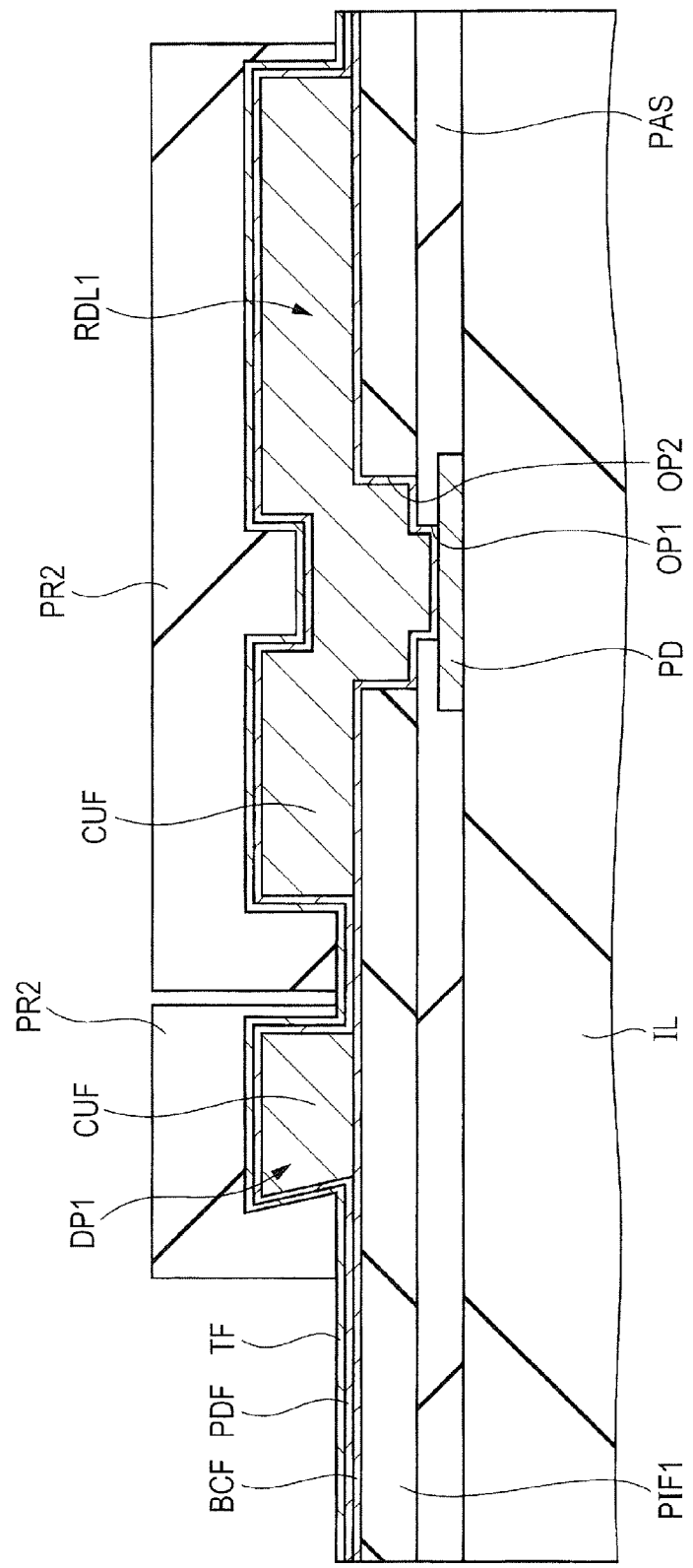
FIG. 19 is a cross-sectional view showing a manufacturing step of the semiconductor device following that of FIG. 18.

Next, as shown in FIG. 19, after formation of a resist film PR2 on the titanium film TF, the resist film PR2 is patterned by photolithography. Patterning of the resist film PR2 is performed so as to cover each of the rewiring RDL1 and the dummy pattern DP1.

Figure 20:
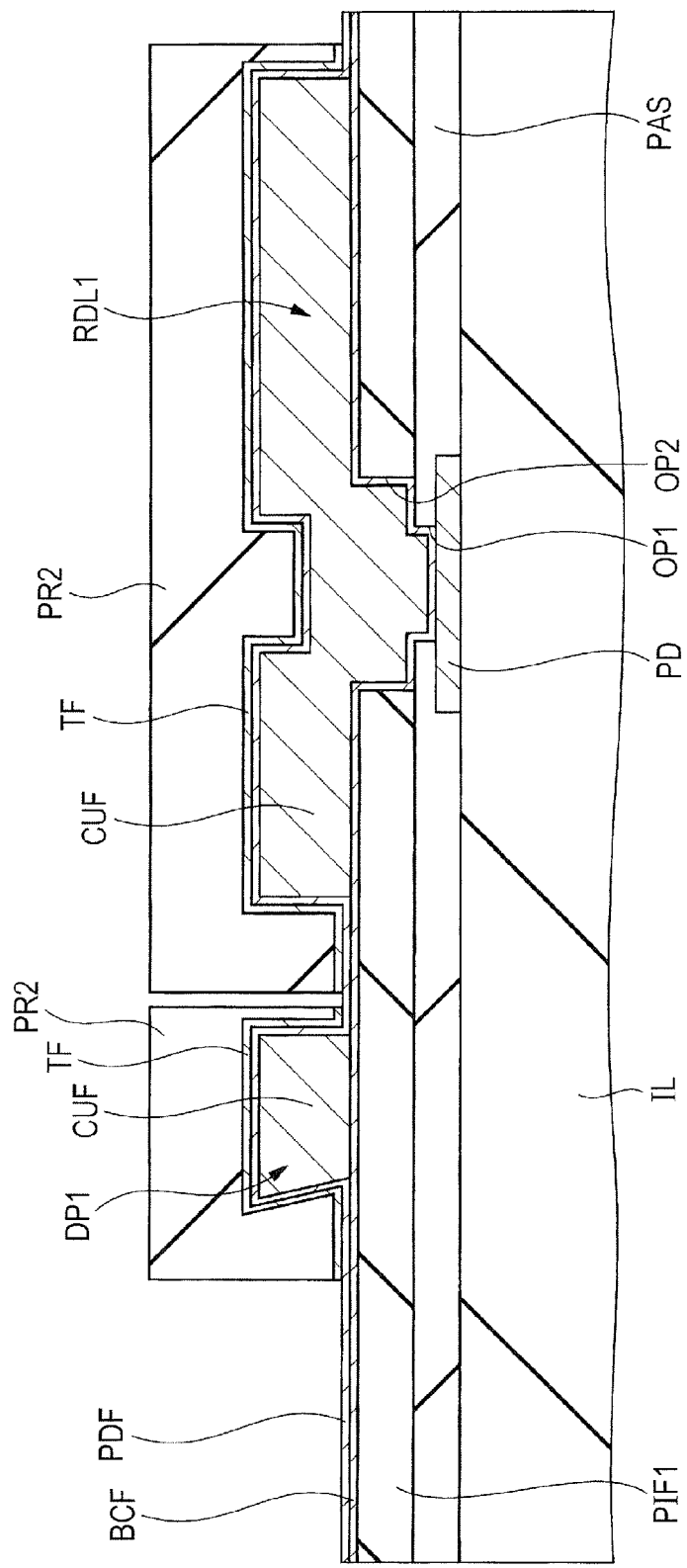
FIG. 20 is a cross-sectional view showing a manufacturing step of the semiconductor device following that of FIG. 19.
Figure 21:
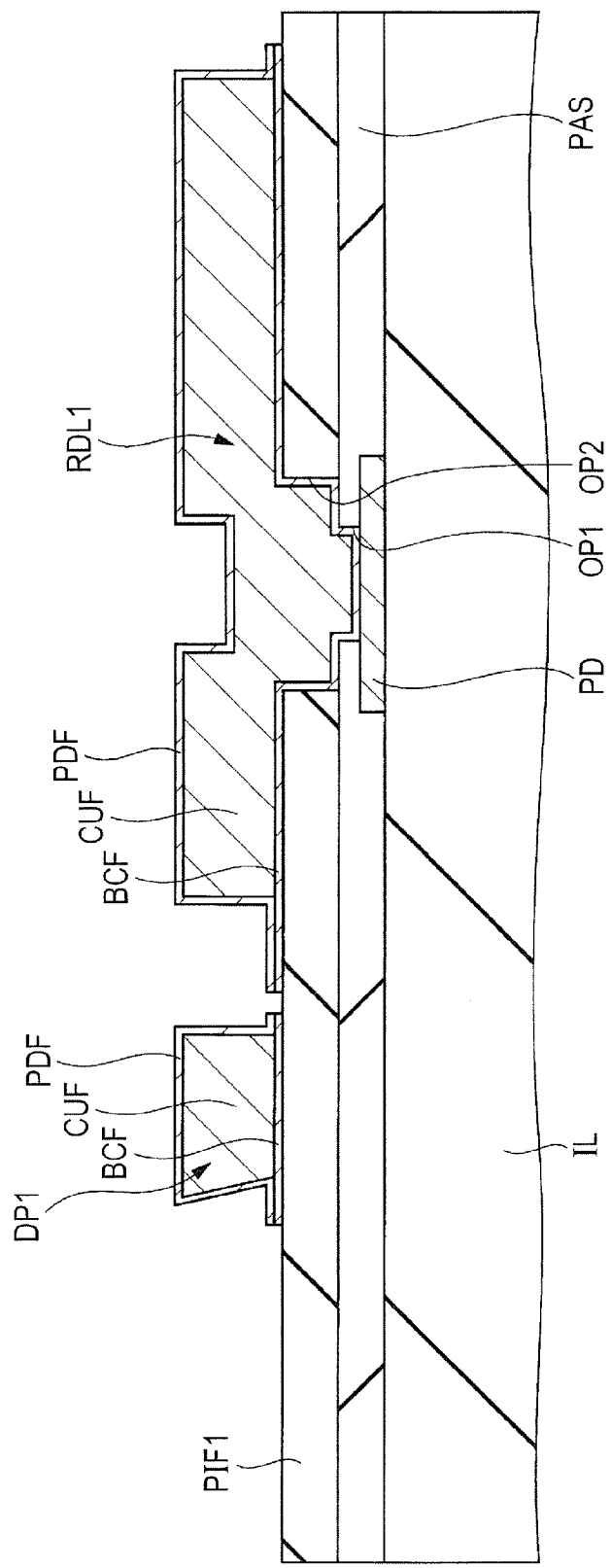
FIG. 21 is a cross-sectional view showing a manufacturing step of the semiconductor device following that of FIG. 20.

Then, as shown in FIG. 20, the titanium film TF exposed from the resist film PR2 is removed by wet etching with the patterned resist film PR2 as a mask. As shown in FIG. 21, after removal of the patterned resist film PR2, the stacked film PDF and the barrier conductor film BCF are patterned by wet etching with the exposed titanium film TF as a mask. At this time, during the step of removing the barrier conductor film BCF, the titanium film TF is removed together. In First Embodiment, since the rewiring RDL1 (copper film CUF) is suppressed from having an inverted tapered side surface, the stacked film PDF and the titanium film TF formed on the side surface of the rewiring RDL1 have adequate thickness. Even wet etching is not likely to cause peeling of the stacked film PDF at the side surface of the rewiring RDL1 and therefore, corrosion of the rewiring RDL1 (copper film CUF) resulting from film peeling can be suppressed. Further, since the film peeling is suppressed, generation of foreign matters is suppressed. According to First Embodiment, therefore, the semiconductor device thus obtained can have improved reliability and in addition, it can be manufactured with an improved yield.

Figure 22:
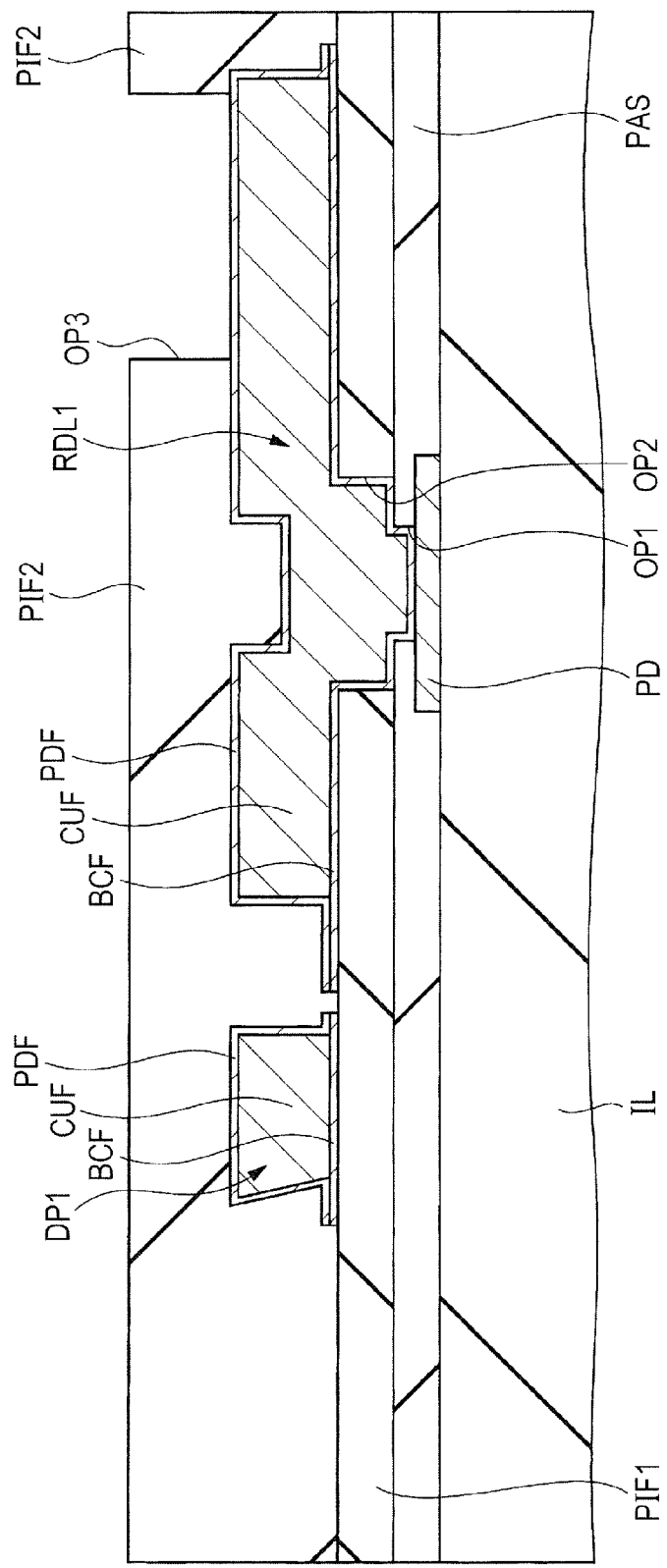
FIG. 22 is a cross-sectional view showing a manufacturing step of the semiconductor device following that of FIG. 21.

Next, as shown in FIG. 22, a polyimide film PIF2 is formed so as to cover the rewiring RDL1 and the dummy pattern DP1. An opening portion OP3 exposing a portion of the rewiring RDL1 is then formed in the polyimide film PIF2 by photolithography. At this time, the stacked film PDF is exposed from the opening portion OP3. The rewiring structure of First Embodiment can be formed as described above. The semiconductor wafer is then divided into individual chip regions by dicing and thus, a plurality of semiconductor chips is obtained. By performing a typical fabrication step, manufacture of the semiconductor device of First Embodiment can be completed.

Next, a technical concept relating to creation of layout data corresponding to the layout (refer to FIG. 9) of the above-described wiring will be described.

More specifically, a layout data creation apparatus for creating layout data corresponding to the layout, in plan view, including a rewiring and a dummy pattern made of a closed pattern surrounding the rewiring, while having a space therebetween will be described.

<Hardware Configuration of Layout Data Creation Apparatus>

Figure 23:
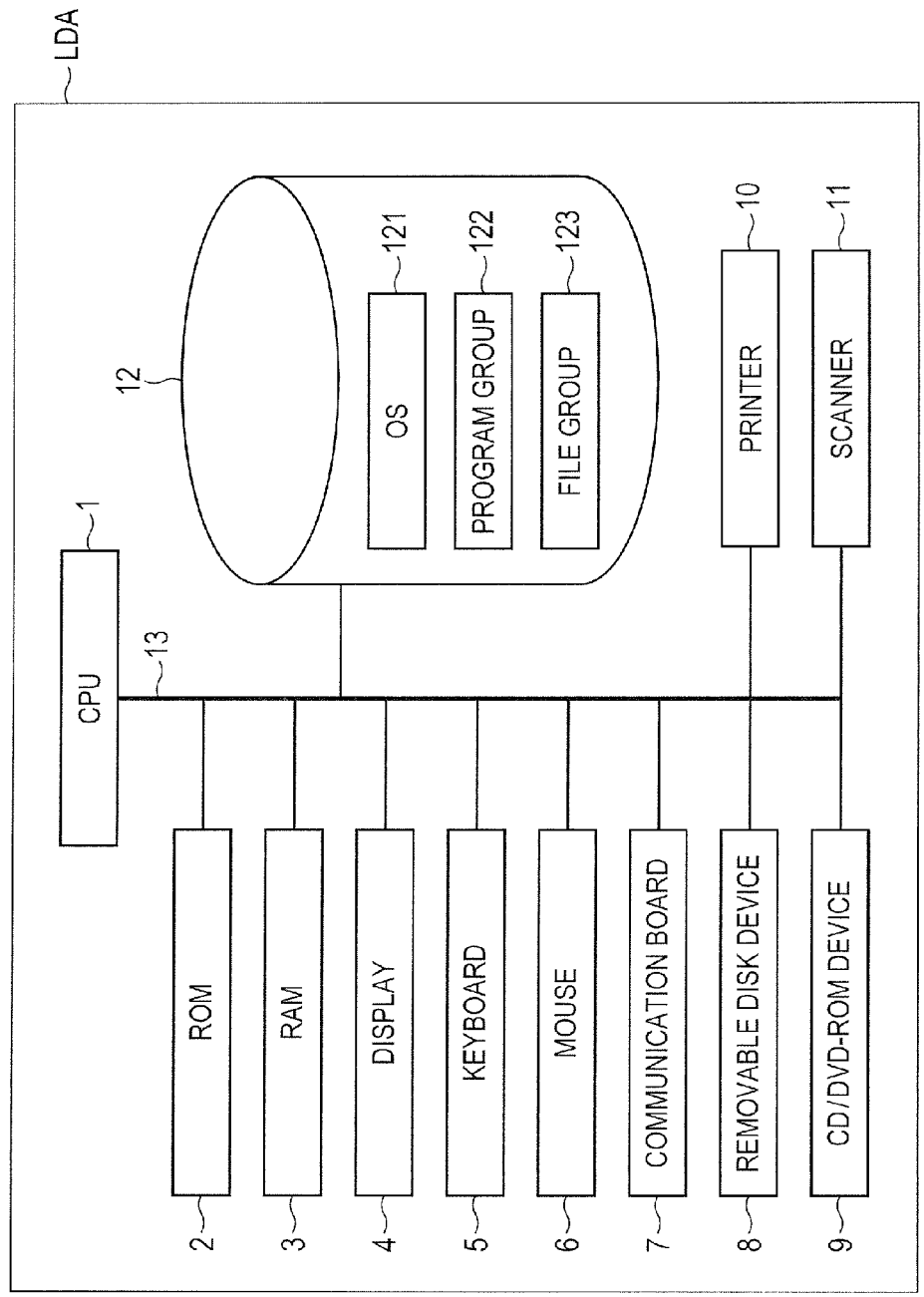
FIG. 23 shows one example of a hardware configuration of a layout data creation apparatus in First Embodiment.

First, hardware configuration of the layout data creation apparatus in First Embodiment will be described. FIG. 23 shows one example of the hardware configuration of a layout data creation apparatus LDA in First Embodiment. The configuration shown in FIG. 23 is only one example of the hardware configuration of the layout data creation apparatus LDA. The hardware configuration of the layout data creation apparatus LDA is not limited to the configuration shown in FIG. 23 but may be another configuration.

In FIG. 23, the layout data creation apparatus LDA in First Embodiment is equipped with a CPU (central processing unit) 1 that executes a program. This CPU1 is electrically coupled to, for example, a ROM (read only memory) 2, a RAM (random access memory) 3, and a hard disk device 12 via a bus 13 so as to control these hardware devices.

The CPU1 is also coupled to an input device and an output device via the bus 13. Examples of the input device include a keyboard 5, a mouse 6, a communication board 7, and a scanner 11. Examples of the output device include a display 4, a communication board 7, and a printer 10. Further, the CPU 1 may be coupled to, for example, a removable disk device 8 or CD/DVD-ROM device 9.

The layout data creation apparatus LDA may be coupled to, for example, a network. For example, when the layout data creation apparatus LDA is coupled to an external apparatus via the network, the communication board 7 configuring a portion of the layout data creation apparatus LDA is coupled to LAN (local area network), WAN (wide area network), or internet.

The RAM 3 is an example of volatile memories, while recording media such as ROM 2, removable disk device 8, CD/DVD-ROM device 9, and hard disk device 12 are examples of nonvolatile memories. These volatile and nonvolatile memories configure a memory device of the layout data creation apparatus LDA.

The hard disk device 12 stores therein, for example, an operating system (OS) 121, a program group 122, and a file group 123. The CPU1 executes a program included in the program group 122 while making use of the operating system 121. The RAM 3 temporarily stores therein at least a portion of the program of the operating system 121 and an application program, each to be executed by the CPU1, and also stores various data necessary for the processing by the CPU1.

The ROM 2 stores therein a BIOS (basic input output system) program and the hard disk device 12 stores therein a boot program. When the layout data creation apparatus LDA is started, the BIOS program stores in the ROM 2 and the boot program stores in the hard disk device 12 are executed and by the BIOS program and the boot program, the operating system 121 is booted.

The program group 122 stores therein a program for realizing the function of the layout data creation apparatus LDA and this program is read and executed by the CPU1. The file group 123 stores therein, as each file item, information, data, signal values, variables, and parameters showing the processing results by the CPU1.

The file is stored in the hard disk device 12 or recording media such as memory. The information, data, signal values, variables, and parameters stored in the hard disk device 12 or recording media such as memory are read by the CPU1 into a main memory or a cache memory and are used for the operation of the CPU1 typified by extraction, search, reference, comparison, arithmetic operation, processing, editing, outputting, printing, and displaying. For example, during the operation of the CPU1, the information, data, signal values, or parameters are stored temporarily in a main memory, a register, a cache memory, or a buffer memory.

The function of the layout data creation apparatus LDA may be realized using firmware stored in the ROM 2 or may be realized using only software, only hardware typified by element/device/substrate/wiring, combination of software and hardware, or combination further with firmware. The firmware and software are stored as a program in recording media typified by the hard disk device 12, a removable disk, a CD-ROM, or a DVD-ROM. The program is read and executed by the CPU1. This means that the program makes a computer function as the layout data creation apparatus LDA.

Thus, the layout data creation apparatus LDA in First Embodiment is a computer equipped with the CPU 1 as a processing apparatus, the hard disk device 12 as a memory device, a keyboard, mouse, or communication board as an input device, and a display, a printer, or a communication board as an output device. Each function of the layout data creation apparatus LDA is realized making use of the above-described processing device, memory device, input device, and output device.

<Functional Configuration of Layout Data Creation Apparatus>

Next, the functional configuration of the layout data creation apparatus LDA in First Embodiment will be described.

Figure 24:
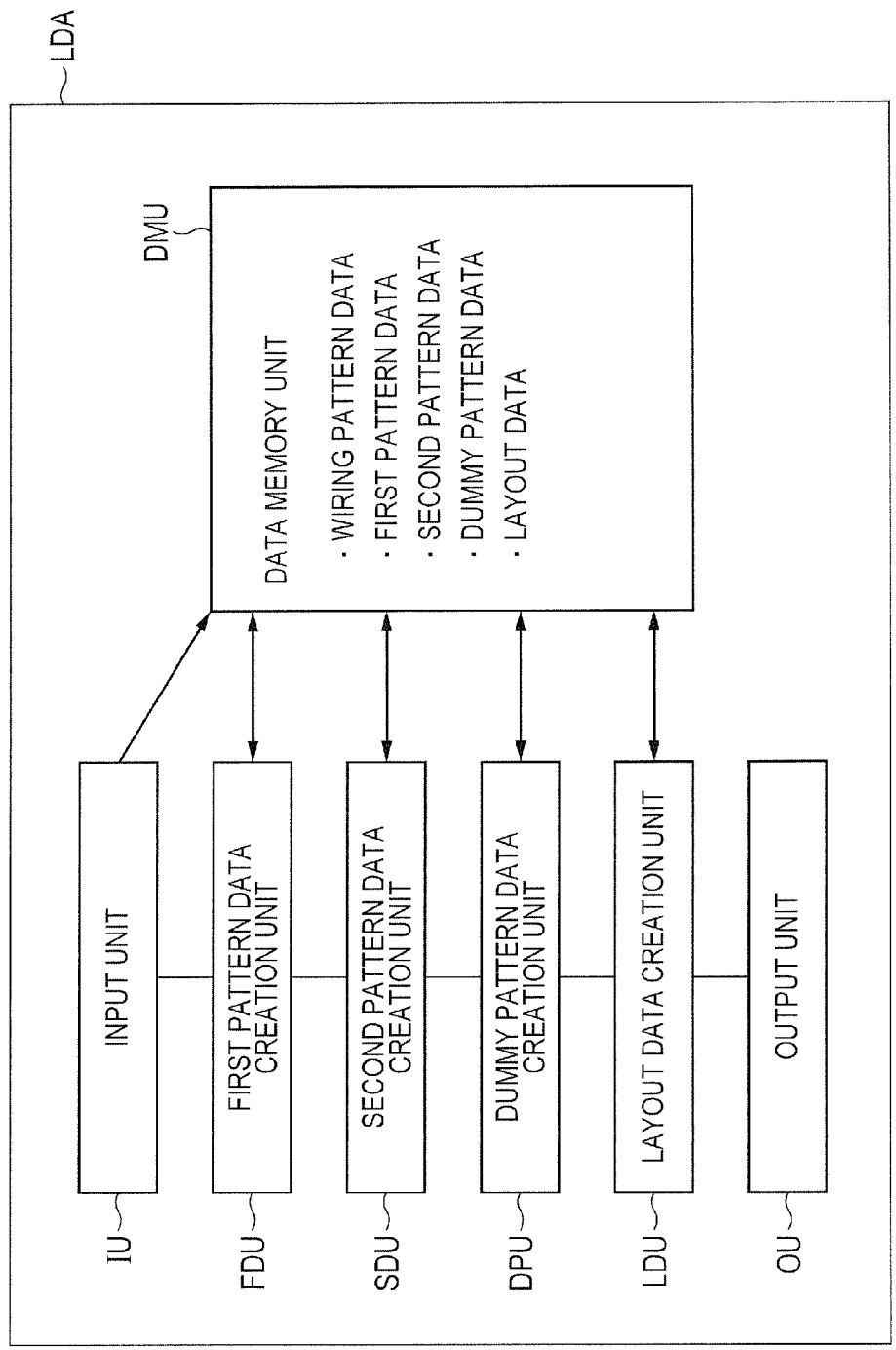
FIG. 24 shows a functional block configuration of the layout data creation apparatus in First Embodiment.

FIG. 24 shows a functional block configuration of the layout data creation apparatus LDA in First Embodiment. In FIG. 24, the layout data creation apparatus LDA in First Embodiment has an input unit IU, a first pattern data creation unit FDU, a second pattern data creation unit SDU, a dummy pattern data creation unit DPU, a layout data creation unit LDU, and an output unit OU, and a data memory unit.

The input unit IU is configured so as to input wiring pattern data corresponding to a wiring pattern of a plurality of wirings and the wiring pattern data input into the layout data creation apparatus LDA from this input unit IU is stored in the data memory unit DMU.

The first pattern data creation unit FDU is configured so as to create, based on the wiring pattern data, first pattern data corresponding to a first pattern obtained by widening the wiring pattern by a width corresponding to the width of a space. The first pattern data created at the first pattern data creation unit FDU are stored in the data memory unit DMU.

The second pattern data creation unit SDU is configured so as to create, based on the first pattern data created at the first pattern data creation unit FDU, second pattern data corresponding to a second pattern obtained by widening the first pattern by a width corresponding to each of the dummy patterns. The second pattern data created at the second pattern data creation unit SDU are stored in the data memory unit DMU.

The dummy pattern data creation unit DPU is configured so as to create dummy pattern data corresponding to a plurality of dummy patterns by subtracting the first pattern data created by the first pattern data creation unit FDU from the second pattern data created by the second pattern data creation unit SDU. The dummy pattern data created by the dummy pattern data creation unit DPU are stored in the data memory unit DMU.

The layout data creation unit LDU is configured so as to create layout data corresponding to a layout pattern including the rewiring and dummy pattern by using the wiring pattern data stored in the data memory unit DMU and the dummy pattern data created by the dummy pattern data creation unit DPU in combination. The layout data created by the layout data creation unit LDU are stored in the data memory unit DMU.

The output unit OU is configured so as to output the layout data created by the layout data creation unit LDU.

<Layout Data Creation Method>

The layout data creation apparatus LDA in First Embodiment is configured as described above. A layout data creation method using this layout data creation apparatus LDA will next be described referring to some drawings.

Figure 25:
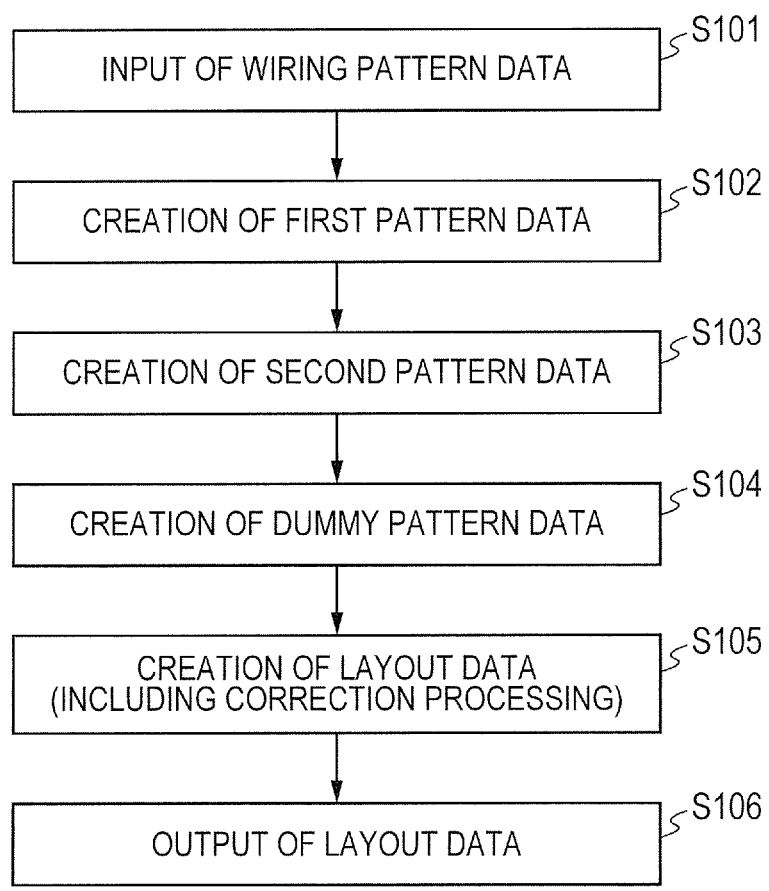
FIG. 25 is a flow chart showing the flow of a layout data creation method in First Embodiment.
Figure 26:
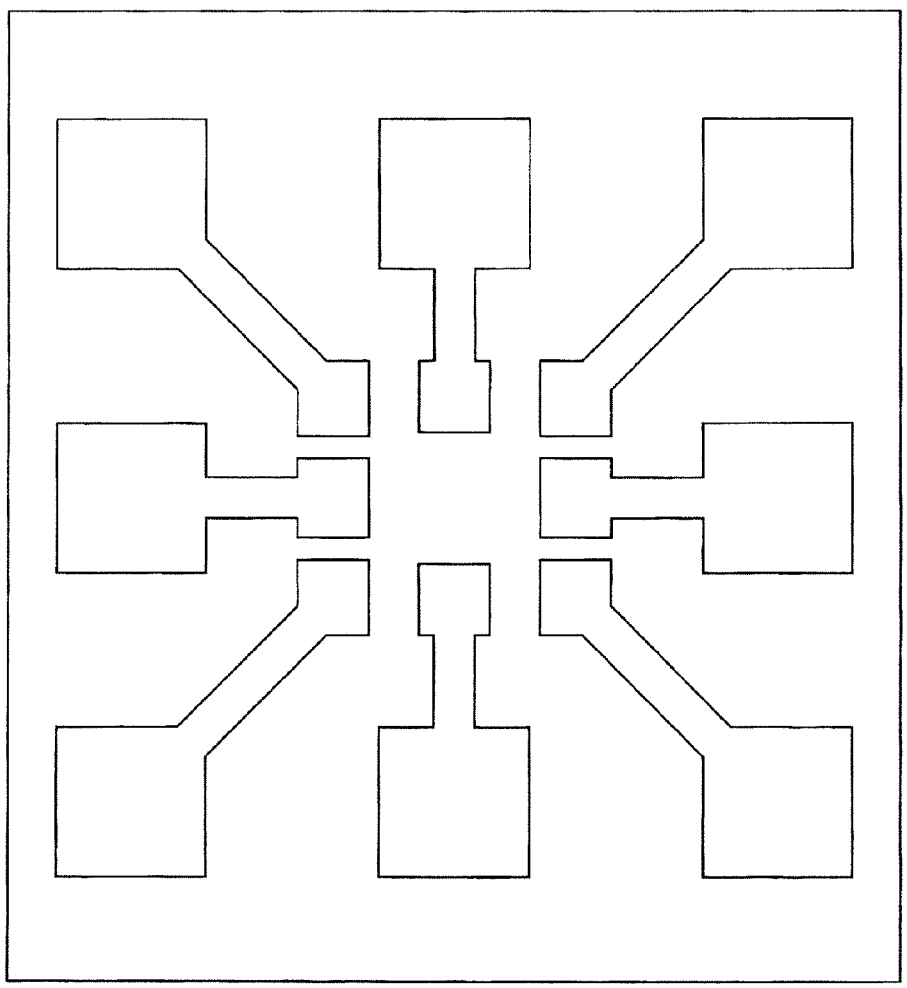
FIG. 26 is a schematic view showing a wiring pattern.

FIG. 25 is a flow chart showing the flow of the layout data creation method in First Embodiment. First, the layout data creation apparatus LDA inputs, from the input unit IU, wiring pattern data corresponding to a wiring pattern of a plurality of rewirings (S101). More specifically, for example, wiring pattern data corresponding to a wiring pattern WPN shown in FIG. 26 are input from the input unit IU.

Figure 27:
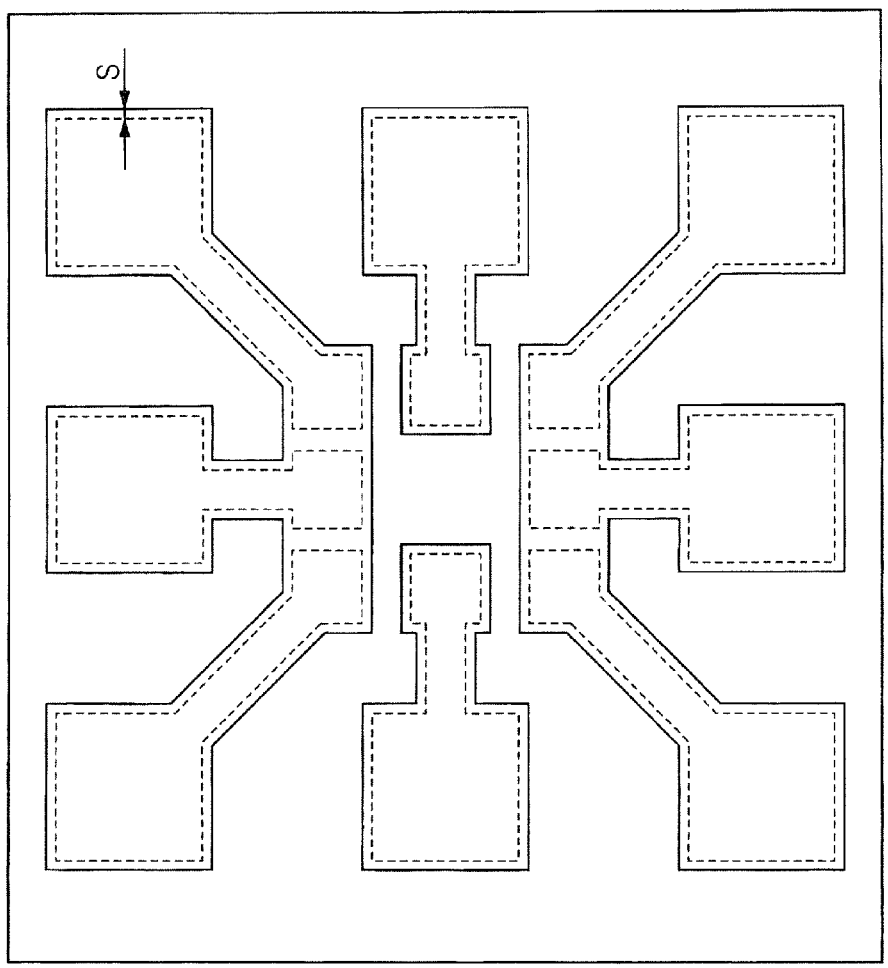
FIG. 27 is a schematic view showing a first pattern.

Next, the first pattern data creation unit FDU of the layout data creation apparatus LDA creates, based on the wiring pattern data input from the input unit IU, first pattern data corresponding to a first pattern obtained by widening the wiring pattern by a width of a space (S102). More specifically, the first pattern creation unit FDU creates, based on the wiring pattern data corresponding to the wiring pattern WPN shown in FIG. 26, first pattern data corresponding to the first pattern FPN obtained by widening the wiring pattern by a width corresponding to a width S of a space as shown in FIG. 27. A pattern indicated by a broken line in FIG. 27 corresponds to the wiring pattern WPN shown in FIG. 26.

Figure 28:
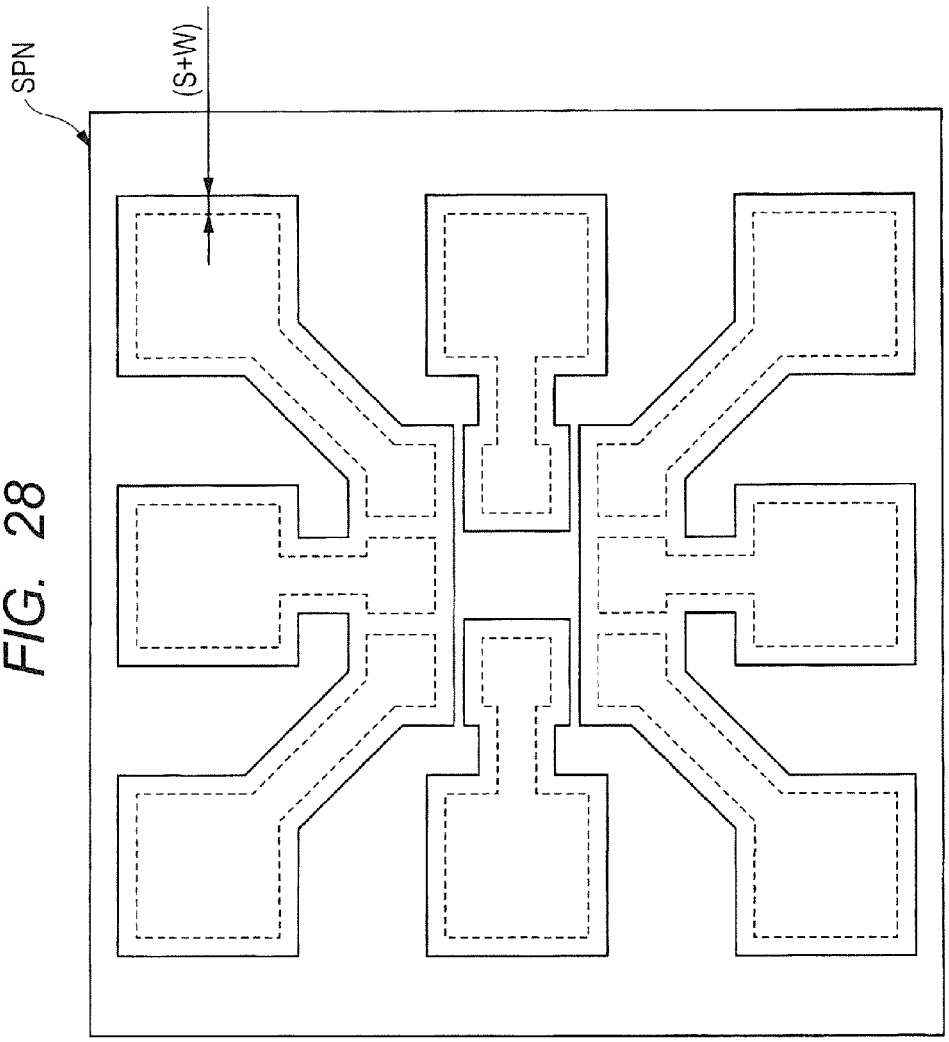
FIG. 28 is a schematic view showing a second pattern.

The second pattern data creation unit SDU of the layout data creation apparatus LDA then creates, based on the first pattern data created by the first pattern data creation unit FDU, second pattern data corresponding to a second pattern obtained by widening the first pattern by a width of each of a plurality of dummy patterns (S103). More specifically, the second pattern data creation unit SDU creates, based on the first pattern data corresponding to the first pattern FPN shown in FIG. 27, second pattern data corresponding to the second pattern SPN obtained by widening by a width W of the dummy pattern as shown in FIG. 28. Also in FIG. 28, a pattern indicated by a broken line corresponds to the wiring pattern WPN shown in FIG. 26.

Figure 29:
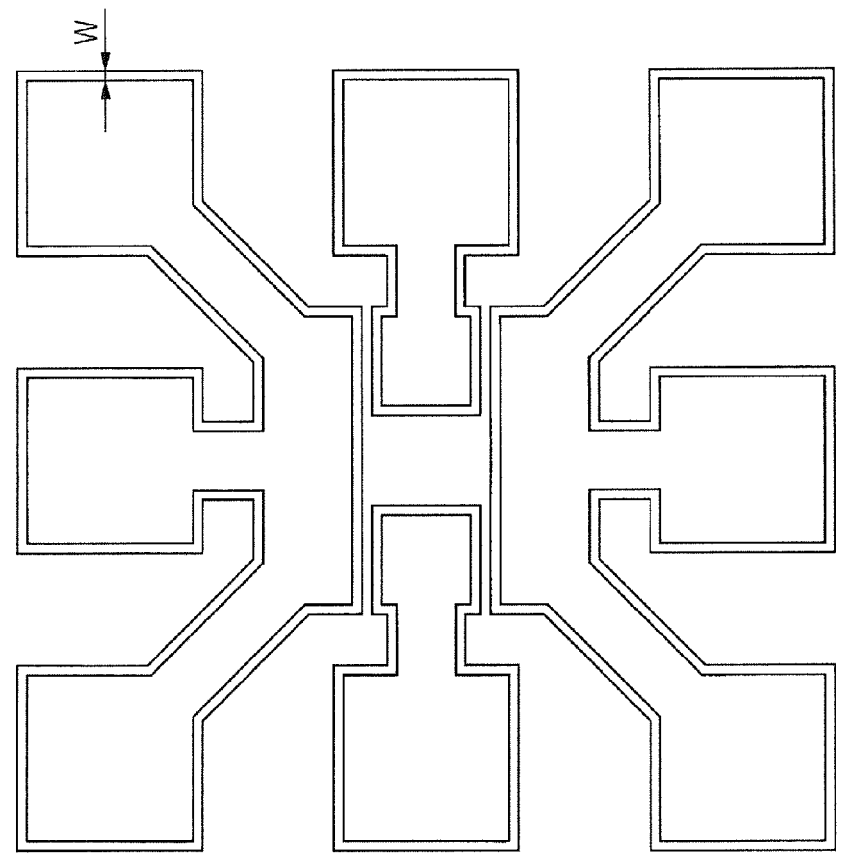
FIG. 29 is a schematic view showing a dummy pattern.

The dummy pattern data creation unit DPU of the layout data creation apparatus LDA creates dummy pattern data corresponding to a plurality of dummy patterns by subtracting the first pattern data created by the first pattern data creation unit FDU from the second pattern data created by the second pattern data creation unit SDU (S104). More specifically, the dummy pattern data creation unit DPU subtracts the first pattern data corresponding to the first pattern FPN shown in FIG. 27 from the second pattern data corresponding to the second pattern SPN shown in FIG. 28. The dummy pattern DPN having a width W shown in FIG. 29 is thus formed.

The layout data creation unit LDU of the layout data creation apparatus LDA creates layout data corresponding to a layout pattern including the rewiring and the dummy pattern, by using, in combination, the wiring pattern data input from the input unit IU and the dummy pattern data created by the dummy patter data creation unit DPU (S105). More specifically, the layout data creation unit LDU, creates layout data corresponding to a layout pattern LPN including the rewiring and the dummy pattern as shown in FIG. 30 by using, in combination, the wiring pattern data corresponding to the wiring pattern WPN shown in FIG. 26 and the dummy pattern data corresponding to the dummy pattern DPN shown in FIG. 29.

The layout data created by the layout data creation unit LDU are then output from the output unit OU (S106). As described above, the layout data creation method in First Embodiment is thus achieved.

<<Correction Processing>>

Figure 30:
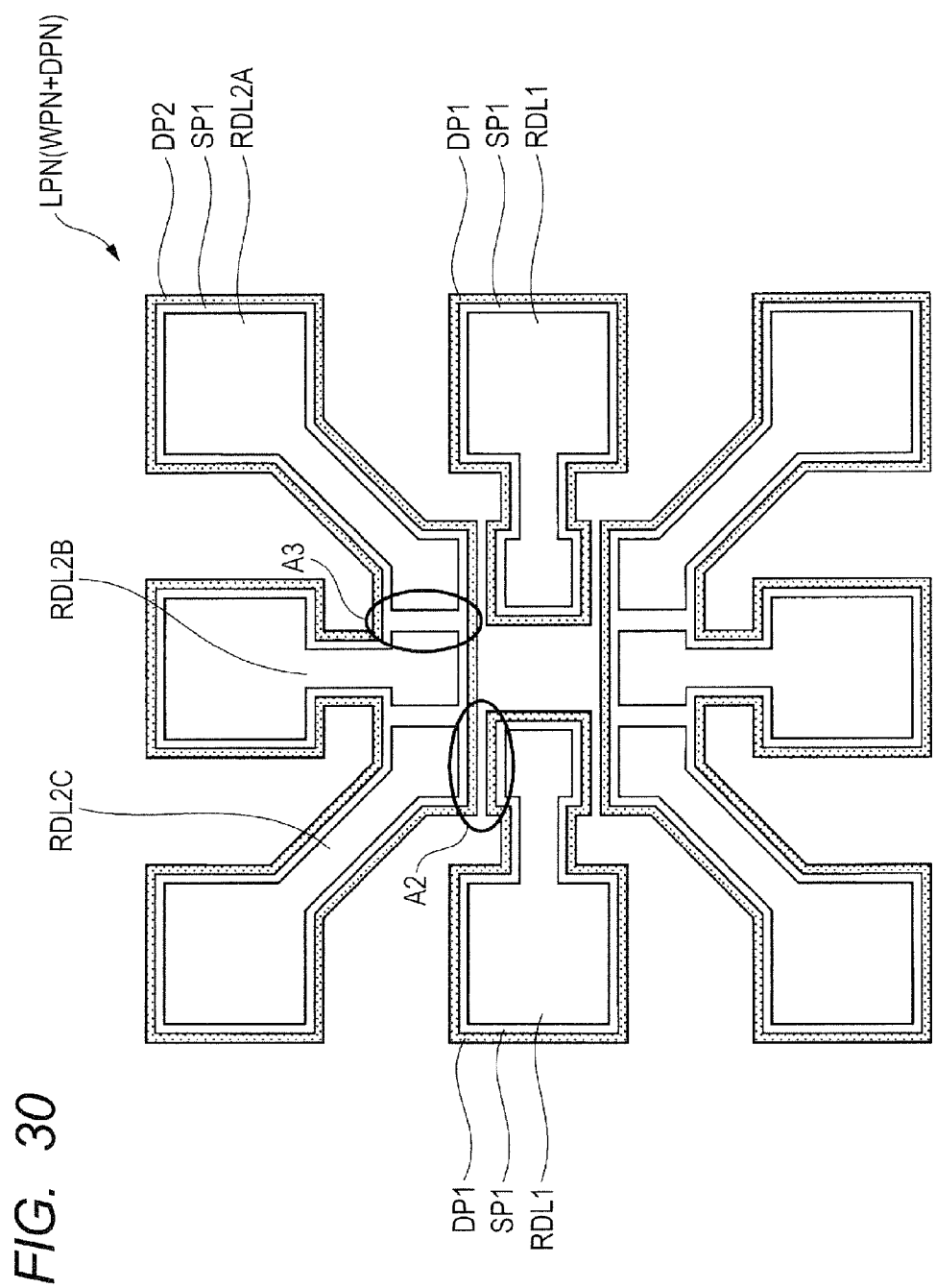
FIG. 30 is a schematic view showing a layout pattern.

Further in First Embodiment, layout data are created by subjecting the layout pattern LPN shown in FIG. 30 to correction processing in the layout data creation unit LDU. This correction processing will next be described.

Figure 31A:
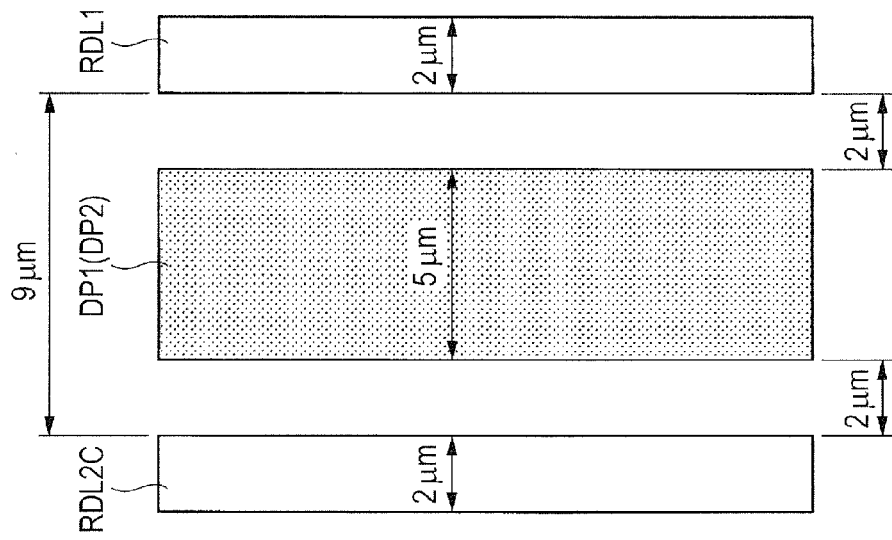
FIG. 31A and FIG. 31B are schematic views describing the details of first correction processing at a layout data creation unit.
Figure 31B:
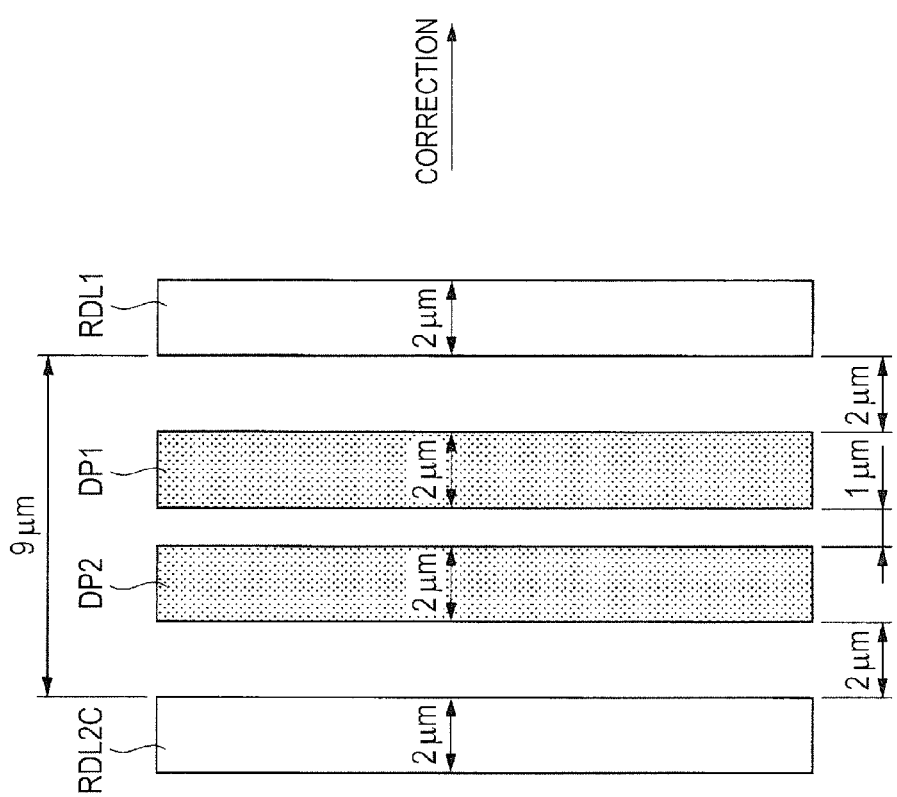

First, first correction processing focused on a region A2 of FIG. 30 will be described. FIGS. 31A and 31B are schematic views describing the details of the first correction processing in the layout data creation unit LDU. As shown in FIG. 31A, the rewiring RDL1 and the rewiring RDL2C have therebetween the dummy pattern DP1 and the dummy pattern DP2. In this drawing, the minimum distance (space) allowable for the rewiring is set at 2 μm. At this time, as shown in FIG. 31A, a distance between the dummy pattern DP1 and the dummy pattern DP2 is 1 μm, which is not allowed because it is smaller than 2 μm, the minimum distance allowed for the rewiring. In this case, the layout data creation unit LDU executes first correction processing for integrally coupling the dummy pattern DP1 to the dummy pattern DP2 as shown in FIG. 31B. This makes it possible to remove a space smaller than the minimum distance allowed for the rewiring. This means that in First Embodiment, the layout data creation unit LDU creates, when a distance between a portion of the dummy pattern DP1 and a portion of the dummy pattern DP2 is narrower than the predetermined distance, layout data by carrying out correction so as to integrally couple the portion of the dummy pattern DP1 to the portion of the dummy pattern DP2. By the first correction processing, for example, the pattern shown in the region A2 of FIG. 30 is corrected into a pattern shown in the region A2 of FIG. 9.

Next, second correction processing focused on a region A3 of FIG. 30 will be described. FIGS. 32A and 32B are schematic views describing the details of the second correction processing in the layout data creation unit LDU. As shown in FIG. 32A, the rewiring RDL2A and the rewiring RDL2B have therebetween the dummy pattern DP1. In this drawing, the minimum width allowed for the rewiring is set at 2 µm. At this time, as shown in FIG. 32A, the width of the dummy pattern DP1 is 1 µm, which is not allowed because it is smaller than 2 µm, the minimum width allowed for the rewiring. In this case, the layout data creation unit LDU executes second correction processing for widening the width of the rewiring RDL2A and the width of the rewiring RDL2B as shown in FIG. 32B without providing the dummy pattern DP1. This makes it possible to omit formation of the dummy pattern DP1 having a width smaller than the minimum width allowed for the rewiring. For example, supposing that there is a layout in which a distance between a portion of the rewiring RDL2A and a portion of the rewiring RDL2B is wider than the predetermined distance; and when one dummy pattern DP1 is placed between the portion of the rewiring RDL2A and the portion of the rewiring RDL2B, the width of the one dummy pattern DP1 becomes smaller than the predetermined distance. In this case, the layout data creation unit LDU creates layout data by, instead of placing the one dummy pattern DP1, carrying out correction processing so as to widen the width of the portion of the rewiring RDL2A and the portion of the rewiring RDL2B to adjust the distance between the portion of the rewiring RDL2A and the portion of the rewiring RDL2B to the predetermined distance. By this second correction processing, the pattern shown in the region A3 of FIG. 30 is corrected into the pattern shown in the region A3 of FIG. 9. In short, by the second correction processing in the layout data creation unit LDU, the width of the space SP2 shown in the region A3 of FIG. 9 is adjusted to be roughly equal to that of the space SP1. In such a manner, the layout pattern including the rewirings (RDL1, RDL2A, RDL2B, and RDL2C) and the dummy patterns (DP1 and DP2) shown in FIG. 9 is finally actualized.

<Layout Data Creation Program>

The layout data creation method executed in the above-described layout data creation apparatus LDA can be achieved according to a layout data creation program that allows a computer to perform layout data creation processing. For example, a layout data creation program of First Embodiment can be introduced into the layout data creation apparatus LDA comprised of a computer as shown in FIG. 23 as one of the program group 122 stored in the hard disk device 12. The layout data creation method in First Embodiment can be achieved by allowing the computer of the layout data creation apparatus LDA to carry out this layout data creation program.

The layout data creation program for allowing a computer to carry out each processing for creating layout data can be recorded in a recording medium readable by a computer and delivered. Examples of such a recording medium include magnetic recording media such as hard disk and flexible disk, optical recording media such as CD-ROM and DVD-ROM, and hardware devices typified by a nonvolatile memory such as ROM and EEPROM.

Second Embodiment

Figure 33:
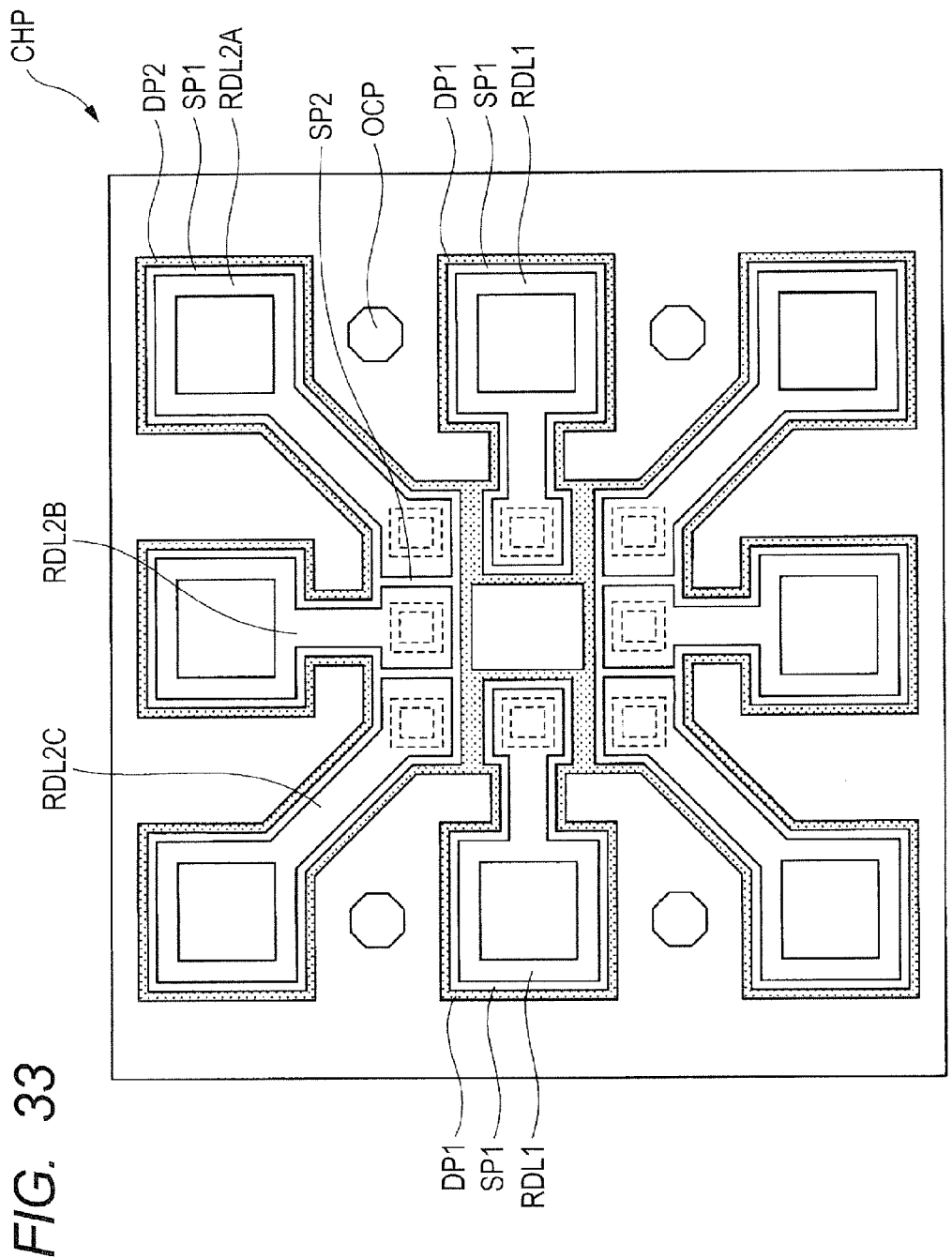
FIG. 33 shows a layout configuration of a semiconductor chip in Second Embodiment.

FIG. 33 shows a planar layout configuration of a semiconductor chip CHP in Second Embodiment. As shown in FIG. 33, the semiconductor chip CHP of Second Embodiment has an occupancy control pattern OCP in the same layer as the rewirings (RDL1, RDL2A, RDL2B, and RDL2C) and the dummy patterns (DP1 and DP2). This means that in Second Embodiment, the polyimide film PIF1 shown in FIG. 10 has thereon the occupancy control pattern OCP. According to Second Embodiment, the occupancy of copper films (copper films configuring the rewiring, the dummy pattern, and the occupancy control pattern, respectively) on the surface of the semiconductor chip CHP can be controlled by it. The copper films on the surface of the semiconductor chip CHP are formed, for example, using electroplating. When the occupancy of the copper film is very small, the copper films cannot be formed stably by electroplating. There may occur the case where even if the areas of the copper films configuring, for example, the rewirings (RDL1, RDL2A, RDL2B, and RDL2C) and the dummy patterns (DP1 and DP2) are totalized, an occupancy enough for stably forming these copper films by electroplating cannot be secured. In this case, by providing the semiconductor chip CHP with the occupancy control pattern OCP as in Second Embodiment, the occupancy of copper films can be improved to enable stable formation of them by electroplating. As a result, according to Second Embodiment, the respective copper films configuring the rewirings (RDL1, RDL2A, RDL2B, and RDL2C), the dummy patterns (DP1 and DP2), and the occupancy control pattern OCP can be formed stably. Due to a marked increase in the occupancy of copper films, however, warp of the semiconductor substrate appears as a problem so that attention should be paid to this point. For example, the occupancy of copper films is desirably from about 35% to 60% both from the standpoint of stably forming copper films by electroplating and from the standpoint of suppressing generation of warp of a semiconductor wafer.

FIG. 33 shows an occupancy control pattern OCP having an octagonal planar shape. The planar shape is not limited to it and the occupancy of copper films can be controlled even when it has a rectangular (square), triangular, hexagonal, circular, or cross shape.

Third Embodiment

Figure 34:
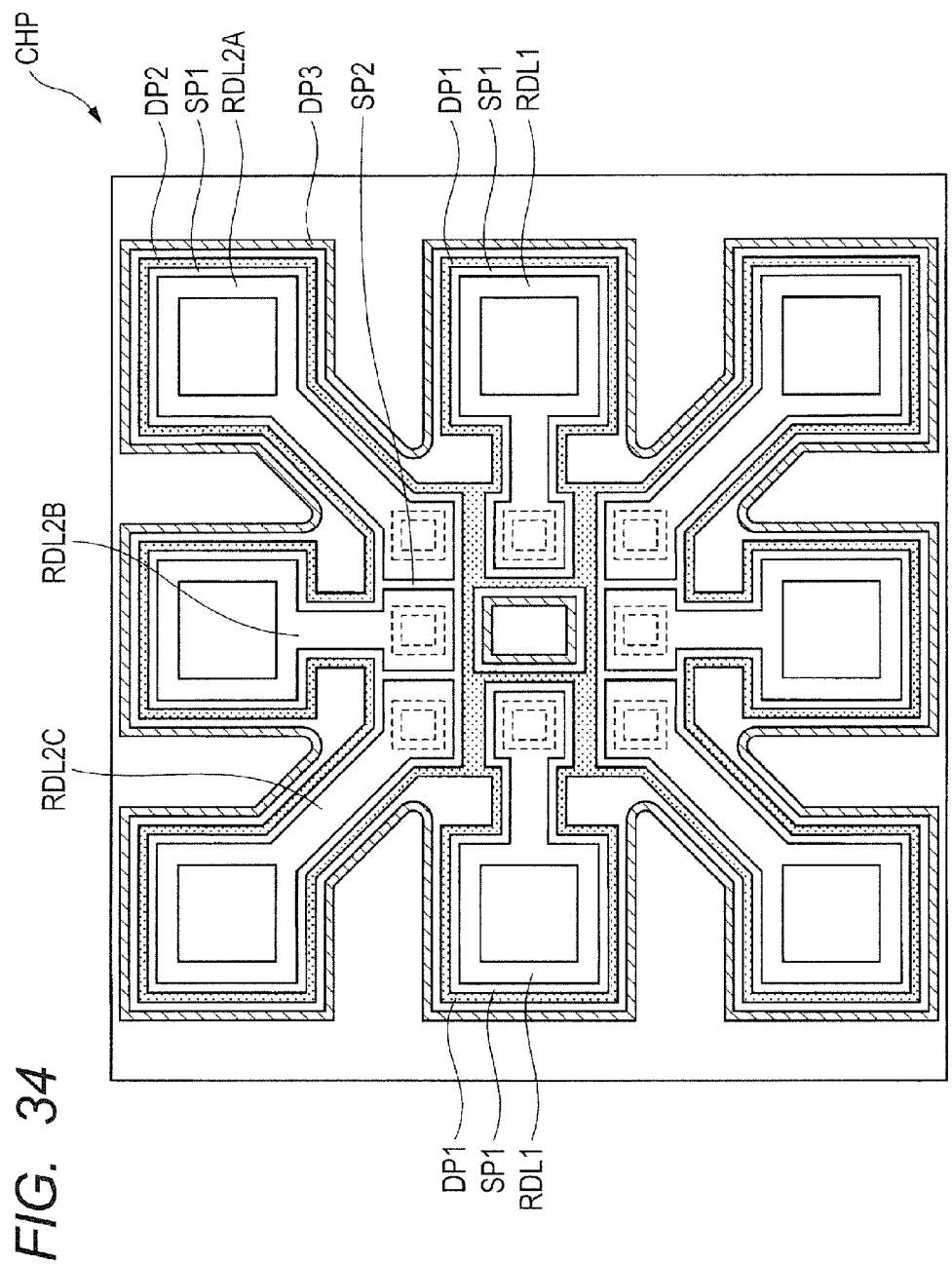
FIG. 34 shows a layout configuration of a semiconductor chip in Third Embodiment.

FIG. 34 shows the planar layout configuration of a semiconductor chip CHP in Third Embodiment. As shown in FIG. 34, the semiconductor chip CHP of Third Embodiment has a dummy pattern DP3 so as to surround, in plan view, the dummy pattern DP1 and the dummy pattern DP2. The dummy pattern DP3 is comprised of a closed pattern surrounding the dummy pattern DP1 and the dummy pattern DP2, while having a space therebetween.

According to Third Embodiment, the rewirings (RDL1, RDL2A, RDL2B, and RDL2C) can be suppressed from having an inverted tapered side surface and at the same time, the dummy pattern DP1 and the dummy pattern DP2 can be suppressed from having an inverted tapered side surface. In First Embodiment, the dummy pattern DP1 and the dummy pattern DP2 can suppress the rewirings (RDL1, RDL2A, RDL2B, and RDL2C) from having an inverted tapered side surface and are therefore effective for preventing corrosion of the copper film configuring the rewiring. In First Embodiment, on the other hand, for example, as shown in FIG. 10, the dummy pattern DP1 is likely to have an inverted tapered side surface. This means that a generation potential of foreign matters resulting from film peeling from the side surface of the dummy pattern DP1 cannot be suppressed completely. According to Third Embodiment, on the other hand, the dummy pattern DP3 surrounds the dummy pattern DP1 and the dummy pattern DP2, while having a space therebetween. According to Third Embodiment, therefore, the dummy pattern DP1 and the dummy pattern DP2 can each be suppressed from having an inverted tapered side surface, leading to reduction in generation potential of foreign matters resulting from film peeling.

Figure 35:
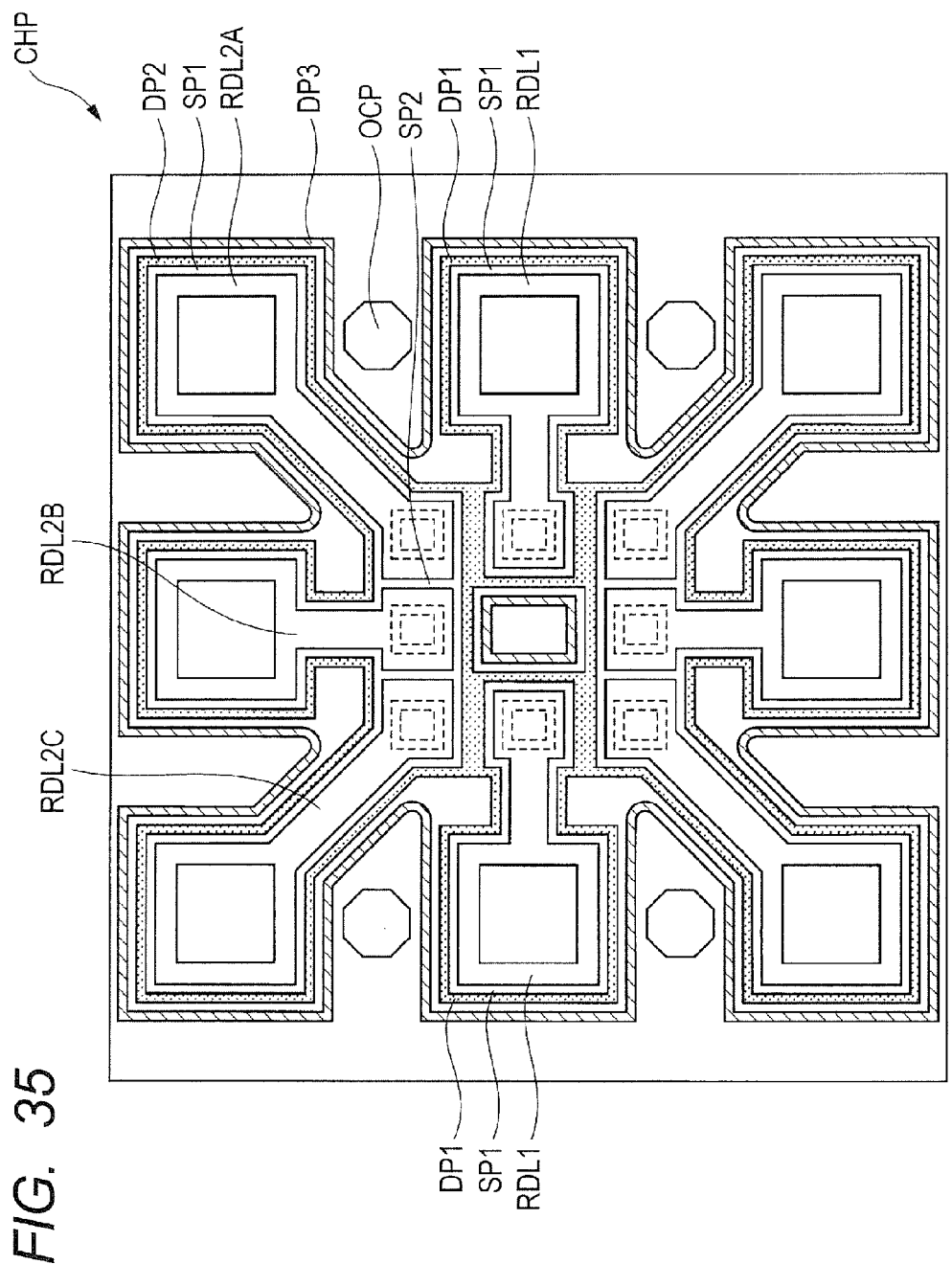
FIG. 35 shows another layout configuration of a semiconductor chip in Third Embodiment.

Further, according to Third Embodiment, the semiconductor chip has, in addition to the dummy pattern DP1 and the dummy pattern DP2, the dummy pattern DP3. Due to the dummy pattern DP3 thus provided, the occupancy of copper films can be improved. According to Third Embodiment, as a result, copper films can be formed stably by electroplating. In the case where an occupancy enough for stably forming copper films by electroplating cannot be secured, for example, as shown in FIG. 35, an occupancy control pattern OCP may be provided on the surface of the semiconductor chip CHP.

MODIFICATION EXAMPLE

Figure 36:
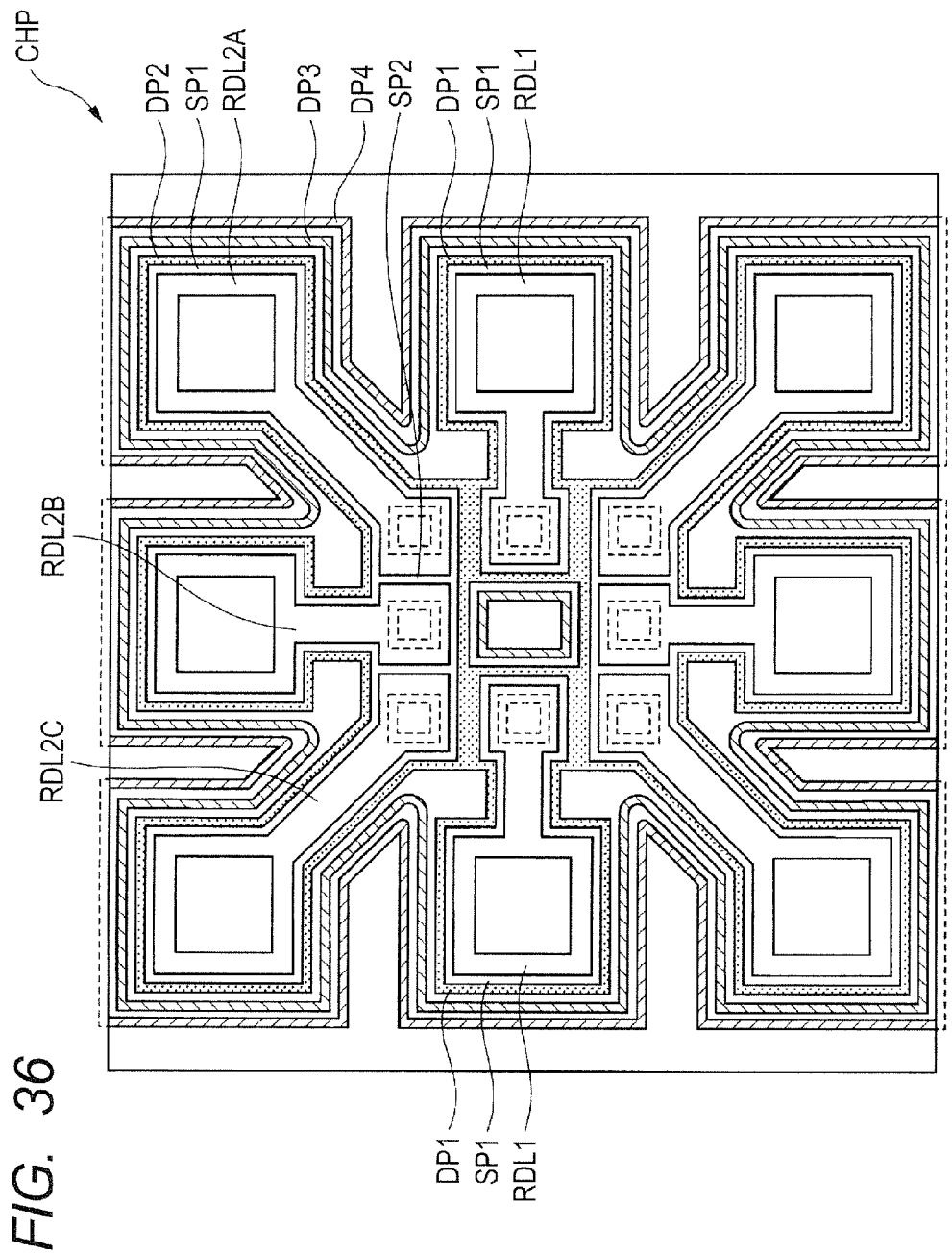
FIG. 36 shows a layout configuration of a semiconductor chip in Modification Example.

FIG. 36 shows a planar layout configuration of a semiconductor chip CHP in Modification Example. As shown in FIG. 36, the semiconductor chip CHP of Modification Example has, in plan view, a dummy pattern DP3 that surrounds the dummy pattern DP1 and the dummy pattern DP2 and further has a dummy pattern DP4 outside the dummy pattern DP3. According to Modification Example, the rewirings (RDL1, RDL2A, RDL2B, and RDL2C) can be suppressed from having an inverted tapered side surface and moreover, the dummy patterns (DP1, DP2, and DP3) can be suppressed from having an inverted tapered side surface. Further, the occupancy of copper films can be improved by providing not only the dummy pattern DP3 but also the dummy pattern DP4. As a result, Modification Example further facilitates stable formation of copper films by electroplating.

As shown in FIG. 36, when the dummy pattern DP4 is comprised of a closed pattern surrounding the dummy pattern DP3, while having a space therebetween and a portion of the dummy pattern DP4 protrudes from the semiconductor chip CHP, removal of the protruding portion is required.

The invention made by the present inventors has been described specifically based on some embodiments. Needless to say that the invention is however not limited to or by these embodiments but can be changed in various ways without departing from the gist of the invention.

The above-described embodiment includes the following modes.

APPENDIX 1

A layout data creation apparatus for creating layout data corresponding to a layout pattern including a wiring pattern corresponding to a plurality of wirings, a first conductor pattern, among a plurality of conductor patterns comprised of a closed pattern surrounding some of the plurality of wirings, while having a space therebetween, and a second conductor pattern, among the plurality of conductor patterns comprised of a closed pattern surrounding some of the other ones of the plurality of wirings, while having a space therebetween, including;

an input unit for inputting wiring pattern data corresponding to the wiring pattern;

a memory unit for storing the wiring pattern data therein;

a first pattern data creation unit for creating, based on the wiring pattern data, first pattern data corresponding to a first pattern obtained by widening the wiring pattern by the width of the space;

a second pattern data creation unit for creating, based on the first pattern data, second pattern data corresponding to a second pattern obtained by widening the first pattern by the width of each of the conductor patterns, a conductor pattern data creation unit for creating conductor pattern data corresponding to the conductor patterns by subtracting the first pattern data from the second pattern data;

a layout data creation unit for creating the layout data corresponding to the layout pattern by using the wiring pattern data and the conductor pattern data in combination; and an output unit for outputting the layout data.

APPENDIX 2

The layout data creation apparatus as described above in Appendix 1, wherein:

the layout data creation unit creates, when a distance between a portion of the first conductor pattern and a portion of the second conductor pattern is narrower than a predetermined distance, the layout data by making a correction to integrally couple the portion of the first conductor pattern to the portion of the second conductor pattern.

APPENDIX 3

The layout data creation apparatus as described above in Appendix 1, wherein the layout data creation unit creates the layout data by making a correction, when in a first wiring and a second wiring, among the plurality of wirings, a distance between a portion of the first wiring and a portion of the second wiring is wider than a predetermined distance while when one of the plurality of conductor patterns is placed between the portion of the first wiring and the portion of the second wiring and it has a width narrower than the predetermined distance, instead of placing one of the conductor patterns, to widen the width of the portion of the first wiring and the width of the portion of the second wiring to adjust a distance between the portion of the first wiring and the portion of the second wiring to the predetermined distance.

APPENDIX 4

A layout data creation method for creating, using a computer, layout data corresponding to a layout pattern including, in plan view, a wiring pattern corresponding to a plurality of wirings, a first conductor pattern, among a plurality of conductor patterns comprised of a closed pattern surrounding some of the plurality of wirings, while having a space therebetween, and a second conductor pattern, among the plurality of conductor patterns comprised of a closed pattern surrounding some of the other ones of the plurality of wirings, while having a space therebetween, including the steps of:

(a) allowing the computer to input wiring pattern data corresponding to the wiring pattern;

(b) allowing the computer to store the wiring pattern data;

(c) allowing the computer to create, based on the wiring pattern data, first pattern data corresponding to a first pattern obtained by widening the wiring pattern by the width of the space;

(d) allowing the computer to create, based on the first pattern data, second pattern data corresponding to a second pattern obtained by widening the first pattern by the width of each of the plurality of conductor patterns;

(e) allowing the computer to create conductor pattern data corresponding to the plurality of conductor patterns by subtracting the first pattern data from the second pattern data;

(f) allowing the computer to create the layout data corresponding to the layout pattern by using the wiring pattern data and the conductor pattern data in combination; and (g) allowing the computer to output the layout data.

APPENDIX 5

A layout data creation program that allows a computer to create layout data corresponding to a layout pattern including, in plan view, a wiring pattern corresponding to a plurality of wirings, a first conductor pattern, among a plurality of conductor patterns comprised of a closed pattern surrounding some of the plurality of wirings, while having a space therebetween, and a second conductor pattern, among the plurality of conductor patterns comprised of a closed pattern surrounding some of the other ones of the plurality of wirings, while having a space therebetween, and allows the computer to execute:

(a) processing for inputting wiring pattern data corresponding to the wiring pattern, (b) processing for storing the wiring pattern data;

(c) processing, based on the wiring pattern data, for creating first pattern data corresponding to a first pattern obtained by widening the wiring pattern by the width of the space;

(d) processing, based on the first pattern data, for creating second pattern data corresponding to a second pattern obtained by widening the first pattern by the width of each of the plurality of conductor patterns;

(e) processing for creating conductor pattern data corresponding to the plurality of conductor patterns by subtracting the first pattern data from the second pattern data;

(f) processing for creating the layout data corresponding to the layout pattern by using the wiring pattern data and the conductor pattern data in combination; and (g) processing for outputting the layout data.

APPENDIX 6

A computer-readable recording medium having, recorded therein, the layout data creation program as described above in Appendix 5.

What is claimed is:

1. A semiconductor device, comprising
a first polyimide film;
a wiring formed over the first polyimide film;
a conductor pattern formed over the first polyimide film;
a second polyimide film that covers the wiring and the conductor pattern; and
an opening portion that exposes a portion of the wiring in the second polyimide film,
wherein, in plan view, the conductor pattern is comprised of a closed pattern surrounding the wiring, while having a space therebetween.

2. The semiconductor device according to claim 1, wherein the wiring and the conductor pattern are placed each other separately with a predetermined distance.

3. The semiconductor device according to claim 1, wherein the wiring comprises:

a barrier conductor film;
a first conductor film formed over the barrier conductor film; and
a second conductor film formed over the first conductor film.

4. The semiconductor device according to claim 3, wherein the second conductor film is formed over the top surface and the side surface of the wiring.

5. The semiconductor device according to claim 4, wherein the first conductor film is comprised of a copper film, and
wherein the second conductor film is comprised of a titanium film and a palladium film formed over the titanium film.

6. The semiconductor device according to claim 5, wherein a copper wire is coupled to the second conductor film exposed from the opening portion.

7. The semiconductor device according to claim 1, wherein the conductor pattern has a floating potential.

8. The semiconductor device according to claim 1, wherein the first polyimide film has thereover an occupancy control pattern.

9. A semiconductor device, comprising:
a first polyimide film;
a plurality of wirings formed over the first polyimide film;
a plurality of conductor patterns formed over the first polyimide film;
a second polyimide film that covers the wirings and the conductor patterns; and
an opening portion that exposes a portion of each of the wirings in the second polyimide film,
wherein, in plan view, a first conductor pattern, among the conductor patterns, is comprised of a closed pattern surrounding a first wiring group, among the wirings, while having a space therebetween.

10. The semiconductor device according to claim 9, wherein, in plan view, a second conductor pattern, among the conductor patterns, is comprised of a closed pattern surrounding a second wiring, among the wirings, while having therebetween a space.

11. The semiconductor device according to claim 10, wherein the first conductor pattern and the second conductor pattern are coupled to each other, and
wherein a width of a coupled portion of the first conductor pattern and the second conductor pattern is greater than a width of the first conductor pattern and a width of the second conductor pattern.

12. The semiconductor device according to claim 9, wherein a third conductor pattern, among the conductor patterns, is comprised of a closed pattern surrounding the first conductor pattern while having a space therebetween.

13. A method of manufacturing a semiconductor device, comprising the steps of:
(a) forming an insulating film that covers a pad;
(b) forming, in the insulating film, a first opening portion exposing a portion of a surface of the pad;
(c) forming a first polyimide film over the insulating film;
(d) forming, in the first polyimide film, a second opening portion to couple with the first opening portion;
(e) forming a wiring that fills the first opening portion and the second opening portion and is allocated over the first polyimide film, and a conductor pattern that be allocated over the first polyimide film;
(f) forming a second polyimide film that covers the wiring and the conductor pattern; and (g) forming, in the second polyimide film, a third opening portion that exposes a portion of the wiring,
wherein in the step (e), the conductor pattern is comprised of a closed pattern that surrounds, in plan view, the wiring, while having a space therebetween.

14. The method of manufacturing a semiconductor device according to claim 13,
wherein the step (e) comprises the steps of:
(e1) forming a barrier conductor film over the first polyimide film including an inner wall of the first opening portion and an inner wall of the second opening portion;
(e2) forming a seed film over the barrier conductor film;
(e3) forming a first resist film over the seed film;
(e4) forming, in the first resist film, an opening portion for forming a wiring and an opening portion for forming a conductor pattern;
(e5) forming a first conductor film in the opening portion for forming the wiring and the opening portion for forming the conductor pattern;
(e6) after the step (e5), removing the first resist film and removing the seed film exposed by removing the first resist film;
(e7) after the step (e6), forming a second conductor film over barrier conductor film including the top surface and side surface of the first conductor film;
(e8) forming a second resist film over the second conductor film;
(e9) patterning the second resist film; and
(e10) removing the exposed second conductor film with the patterned second resist film as a mask.

15. The method of manufacturing a semiconductor device according to claim 14,
wherein the step (e4) further comprises the steps of:
(e41) patterning the first resist film; and
(e42) after the step (e41), curing the patterned first resist film.

16. The method of manufacturing a semiconductor device according to claim 14,
wherein in the step (e7), forming the second conductor film by sputtering.

17. The method of manufacturing a semiconductor device according to claim 16,
wherein the second conductor film has a titanium film and a palladium film.

18. The method of manufacturing a semiconductor device according to claim 14,
wherein in the step (e10), the exposed second conductor film is removed by wet etching.

* * * * *